US012399423B2

(12) United States Patent
Tao et al.

(10) Patent No.: US 12,399,423 B2
(45) Date of Patent: Aug. 26, 2025

(54) METHOD FOR TRAINING MACHINE LEARNING MODEL TO DETERMINE OPTICAL PROXIMITY CORRECTION FOR MASK

(71) Applicant: ASML NETHERLANDS B.V., Veldhoven (NL)

(72) Inventors: Jun Tao, Cupertino, CA (US); Stanislas Hugo Louis Baron, San Jose, CA (US); Jing Su, Fremont, CA (US); Ya Luo, Saratoga, CA (US); Yu Cao, Saratoga, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 775 days.

(21) Appl. No.: 17/429,770

(22) PCT Filed: Jan. 24, 2020

(86) PCT No.: PCT/EP2020/051778
§ 371 (c)(1),
(2) Date: Aug. 10, 2021

(87) PCT Pub. No.: WO2020/169303
PCT Pub. Date: Aug. 27, 2020

(65) Prior Publication Data
US 2022/0137503 A1    May 5, 2022

Related U.S. Application Data

(60) Provisional application No. 62/808,410, filed on Feb. 21, 2019.

(51) Int. Cl.
*G03F 1/36* (2012.01)
*G06T 7/00* (2017.01)
*G06T 7/60* (2017.01)

(52) U.S. Cl.
CPC ........... *G03F 1/36* (2013.01); *G06T 7/001* (2013.01); *G06T 7/60* (2013.01); *G06T 2207/20081* (2013.01); *G06T 2207/30148* (2013.01)

(58) Field of Classification Search
CPC .... G03F 1/36; G03F 7/70125; G03F 7/70441; G03F 7/705; G06T 7/001; G06T 7/60;
(Continued)

(56) References Cited

U.S. PATENT DOCUMENTS

| 5,229,872 A | 7/1993 | Mumola |
| 5,296,891 A | 3/1994 | Vogt et al. |

(Continued)

FOREIGN PATENT DOCUMENTS

| CN | 1622206 | 6/2005 |
| CN | 101359170 | 2/2009 |

(Continued)

OTHER PUBLICATIONS

International Search Report and Written Opinion issued in corresponding PCT Patent Application No. PCT/EP2020/051778, dated May 4, 2020.

(Continued)

*Primary Examiner* — Nha T Nguyen
(74) *Attorney, Agent, or Firm* — Pillsbury Winthrop Shaw Pittman LLP

(57) ABSTRACT

Training methods and a mask correction method. One of the methods is for training a machine learning model configured to predict a post optical proximity correction (OPC) image for a mask. The method involves obtaining (i) a pre-OPC image associated with a design layout to be printed on a substrate, (ii) an image of one or more assist features for the mask associated with the design layout, and (iii) a reference post-OPC image of the design layout; and training the (Continued)

machine learning model using the pre-OPC image and the image of the one or more assist features as input such that a difference between the reference image and a predicted post-OPC image of the machine learning model is reduced.

20 Claims, 22 Drawing Sheets

(58) Field of Classification Search
CPC .......... G06T 2207/20081; G06T 2207/30148; G06N 3/045; G06N 3/08
See application file for complete search history.

(56) References Cited

U.S. PATENT DOCUMENTS

| | | | |
|---|---|---|---|
| 5,523,193 | A | 6/1996 | Nelson |
| 5,969,441 | A | 10/1999 | Loopstra et al. |
| 6,046,792 | A | 4/2000 | Van Der Werf et al. |
| 7,003,758 | B2 | 2/2006 | Ye et al. |
| 7,587,704 | B2 | 9/2009 | Ye et al. |
| 7,707,538 | B2 | 4/2010 | Wong et al. |
| 7,882,480 | B2 | 2/2011 | Ye et al. |
| 8,200,468 | B2 | 6/2012 | Ye et al. |
| 9,360,766 | B2 | 6/2016 | Ye et al. |
| 9,779,186 | B2 | 10/2017 | Ye et al. |
| 10,198,550 | B2 | 2/2019 | Lutich |
| 10,579,764 | B2 * | 3/2020 | Sha .......................... G06N 3/08 |
| 2006/0066855 | A1 | 3/2006 | Den Boef et al. |
| 2010/0315614 | A1 | 12/2010 | Hansen |
| 2019/0147134 | A1 * | 5/2019 | Wang ...................... G06F 30/20 716/52 |
| 2020/0050099 | A1 | 2/2020 | Su et al. |
| 2020/0082051 | A1 * | 3/2020 | Kwon ...................... G06N 3/08 |
| 2020/0174380 | A1 * | 6/2020 | Huang ................... G06N 3/045 |
| 2024/0079206 | A1 * | 3/2024 | Kim ...................... H01J 37/222 |

FOREIGN PATENT DOCUMENTS

| | | |
|---|---|---|
| CN | 101751502 | 6/2010 |
| CN | 104865788 | 8/2015 |
| CN | 107908071 | 4/2018 |
| CN | 110692017 | 1/2020 |
| TW | 201510636 | 3/2015 |
| TW | 201901285 | 1/2019 |
| TW | I694343 | 5/2020 |
| WO | 2008029611 | 3/2008 |
| WO | 2010059954 | 5/2010 |
| WO | 2016008711 | 1/2016 |
| WO | 2018/125219 | 7/2018 |
| WO | 2019048506 | 3/2019 |

OTHER PUBLICATIONS

Wang, S. et al.: "Machine learning assisted SRAF placement for full chip", Proc. of SPIE, vol. 10451 (Oct. 2017).
Xu, X. et al.: "A Machine Learning Based Framework for Sub-Resolution Assist Feature Generation", International Symposium on Physical Design, pp. 161-168 (Apr. 2016).
Aafalawieh, M.B. et al.: "GAN-SRAF: Sub-Resolution Assist Feature Generation Using Conditional Generative Adversarial Networks", 2019 56th ACM/IEEE Design Automation Conference (DAC), Association for Computing Machinery, pp. 1-6 (Jun. 2, 2019).
Yu, Bo-Yi. et al.: Deep learning-based framework for comprehensive mask optimization, 2019 Association of Computing Machinery, Jan. 21, 2019 (Jan. 21, 2019), pp. 311-316.
Spence, C.: "Full-Chip Lithography Simulation and Design Analysis—How OPC Is Changing IC Design", Proc. of SPIE, vol. 5751, pp. 1-14 (2005).
Cao, Y. et al.: "Optimized Hardware and Software for Fast, Full Chip Simulation", Proc. of SPIE, vol. 5754 (2005).
Rosenbluth, A.E. et al.: "Optimum Mask and Source Patterns to Print a Given Shape", Journal of Microlithography, Microfabrication, Microsystems 1(1), pp. 13-20 (2002).
Granik, Y.: "Source Optimization for Image Fidelity and Throughput", Journal of Microlithography, Microfabrication, Microsystems 3(4), pp. 509-522 (Oct. 2004).
Socha, R. et al.: "Simultaneous Source Mask Optimization (SMO)", Proc. of SPIE, vol. 5853 (2005).
Nocedal, J. et al.: "Numerical Optimization", Second Edition, Cambridge University Press, Springer (2006).
Taiwanese Office Action issued in corresponding Taiwanese Patent Application No. 109104469, dated Feb. 3, 2021.
Office Action issued in corresponding Korean Patent Application No. 10-2021-7026561, dated May 23, 2023.
Taiwanese Office Action issued in corresponding Taiwanese Patent Application No. 110137906, dated Aug. 15, 2022.
Office Action issued in corresponding Chinese Patent Application No. 202080015204.6, dated Dec. 28, 2023.
Office Action issued in corresponding Chinese Patent Application No. 202080015204.6, dated Sep. 6, 2024.

* cited by examiner

METHOD FOR TRAINING MACHINE LEARNING MODEL TO DETERMINE OPTICAL PROXIMITY CORRECTION FOR MASK

CROSS-REFERENCE TO RELATED APPLICATIONS

This application is the U.S. national phase entry of PCT Patent Application No. PCT/EP2020/051778 which was filed on Jan. 24, 2020, which claims the benefit of priority of U.S. Patent Application No. 62/808,410 which was filed on Feb. 21, 2019 and which is incorporated herein in its entirety by reference.

TECHNICAL FIELD

The description herein relates to lithographic apparatuses and processes, and more particularly method for determining corrections for a patterning process.

BACKGROUND

A lithographic projection apparatus can be used, for example, in the manufacture of integrated circuits (ICs). In such a case, a patterning device (e.g., a mask) may contain or provide a circuit pattern corresponding to an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithographic projection apparatus, one target portion at a time. In one type of lithographic projection apparatuses, the circuit pattern on the entire patterning device is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithographic projection apparatus will have a magnification factor M (generally <1), the speed F at which the substrate is moved will be a factor M times that at which the projection beam scans the patterning device. More information with regard to lithographic devices as described herein can be gleaned, for example, from U.S. Pat. No. 6,046,792, incorporated herein by reference.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, microlithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$, is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic projection apparatus and/or design layout. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

BRIEF SUMMARY

In an embodiment, there is provided a method of training a machine learning model configured to predict a post optimal proximity correction (OPC) image for a mask. The method involves obtaining (i) a pre-OPC image associated with a design layout to be printed on a substrate, (ii) an image of one or more assist features for the mask associated with the design layout, and (iii) a reference post-OPC image of the design layout; and training the machine learning model using the pre-OPC image and the image of the one or more assist features as input such that a difference between the reference image and a predicted post-OPC image of the machine learning model is reduced.

Furthermore, in an embodiment, there is provided a method for training a machine learning model to predict a post optimal proximity correction (OPC) for a mask. The method involves obtaining (i) a pre-OPC image associated with a design layout to be printed on a substrate, and (ii) a reference post-OPC image of the design layout; and training the machine learning model using the pre-OPC image as input such that a difference between a predicted post-OPC image of the machine learning model and the reference image is reduced.

Furthermore, there is provided a method for determining a post-OPC image for a mask. The method involves obtaining a pre-OPC image associated with a design layout to be printed on a substrate; determining a first post-OPC image of the mask by simulating a trained first machine learning model using the pre-OPC image, wherein the first post-OPC image comprises one or more assist features for the mask; extracting geometric shapes of the one or more assist features of the first post-OPC image; and determining a second post-OPC image for the mask by simulating a trained second machine learning model using the pre-OPC image of the design layout and the extracted geometric shapes of the one or more assist features of the first post-OPC image.

Furthermore, in an embodiment, there is provided A method for determining corrections to a design layout. The method involves obtaining (i) a predicted post-OPC image via a training machine learning model that uses a pre-OPC image of the design layout and an image of the one or more assist features associated with the design layout, and (ii) geometric shapes of the design layout; dissecting the geometric shapes of the design layout into a plurality of segments; and determining corrections to the plurality of segments such that a difference between an image of the design layout and the predicted post-OPC image along the geometric shapes is reduced.

Furthermore, there is provided A computer program product comprising a non-transitory computer readable medium having instructions recorded thereon, the instructions when executed by a computer implementing the method of any of the above claims.

BRIEF DESCRIPTION OF THE DRAWINGS

Embodiments will now be described, by way of example only, with reference to the accompanying drawings in which.

Figure 1:
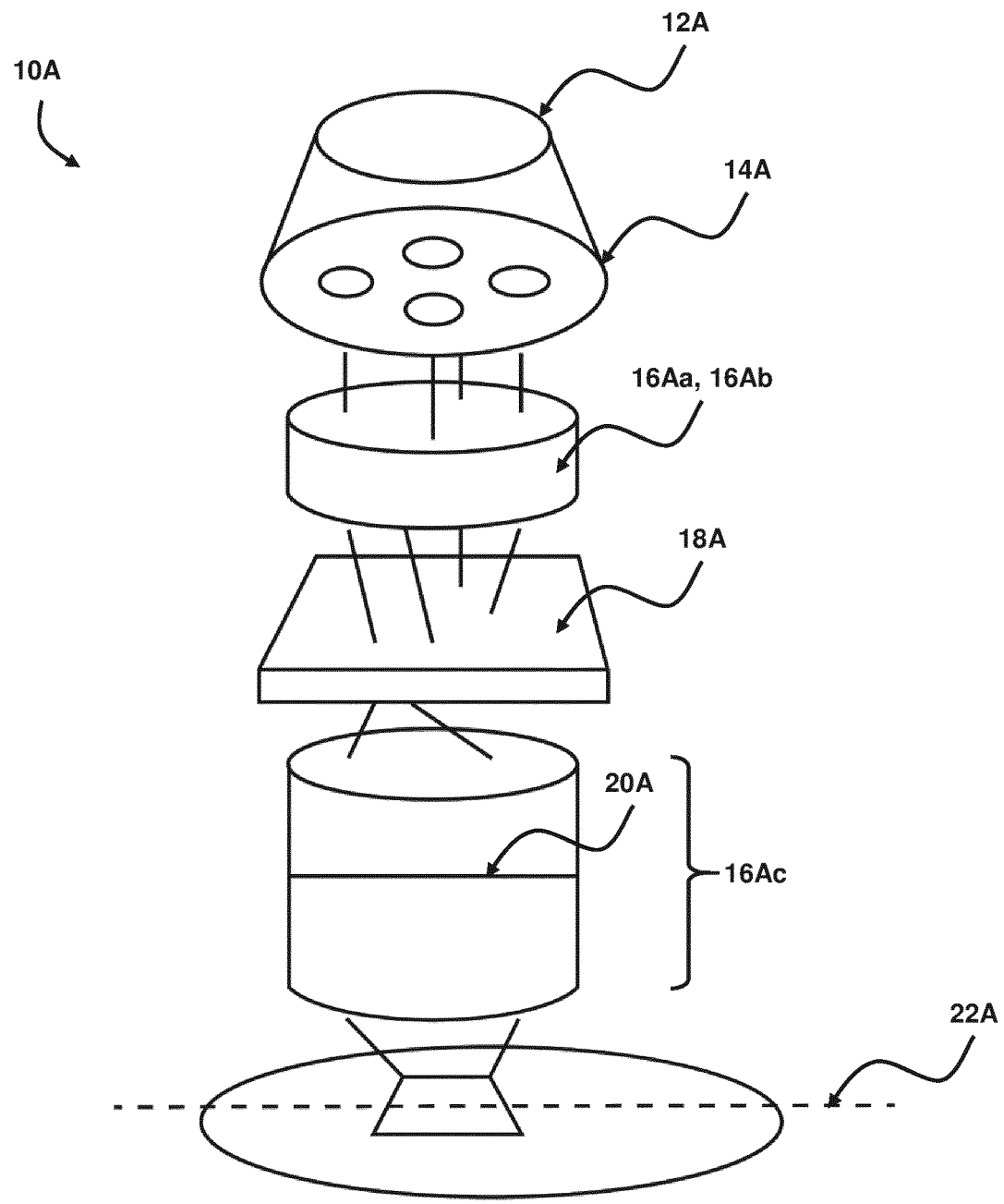
FIG. 1 is a block diagram of various subsystems of a lithography system, according to an embodiment.

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

DETAILED DESCRIPTION

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein mean adjusting a lithographic projection apparatus such that results and/or processes of lithography have more desirable characteristics, such as higher accuracy of projection of design layouts on a substrate, larger process windows, etc.

Further, the lithographic projection apparatus may be of a type having two or more substrate tables (and/or two or more patterning device tables). In such "multiple stage" devices the additional tables may be used in parallel, or preparatory steps may be carried out on one or more tables while one or more other tables are being used for exposures. Twin stage lithographic projection apparatuses are described, for example, in U.S. Pat. No. 5,969,441, incorporated herein by reference.

The patterning device referred to above comprises or can form design layouts. The design layouts can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

a programmable LCD array. An example of such a construction is given in U.S. Pat. No. 5,229,872, which is incorporated herein by reference.

As a brief introduction, FIG. 1 illustrates an exemplary lithographic projection apparatus 10A. Major components are a radiation source 12A, which may be a deep-ultraviolet excimer laser source or other type of source including an extreme ultra violet (EUV) source (as discussed above, the lithographic projection apparatus itself need not have the radiation source), illumination optics which define the partial coherence (denoted as sigma) and which may include optics 14A, 16Aa and 16Ab that shape radiation from the source 12A; a patterning device 14A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=sin($\Theta_{max}$).

In an optimization process of a system, a figure of merit of the system can be represented as a cost function. The optimization process boils down to a process of finding a set of parameters (design variables) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations (i.e., worst deviation). The term "evaluation points" herein should be interpreted broadly to include any characteristics of the system. The design variables of the system can be confined to finite ranges and/or be interdependent due to practicalities of implementations of the system. In case of a lithographic projection apparatus, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

In a lithographic projection apparatus, a source provides illumination (i.e. light); projection optics direct and shapes the illumination via a patterning device and onto a substrate. The term "projection optics" is broadly defined here to include any optical component that may alter the wavefront of the radiation beam. For example, projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in commonly assigned U.S. patent application Ser. No. 12/315,849, disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the patterning device and the projection optics) dictate the aerial image. Since the patterning device used in the lithographic projection apparatus can be changed, it is desirable to separate the optical properties of the patterning device from the optical properties of the rest of the lithographic projection apparatus including at least the source and the projection optics.

Figure 2:
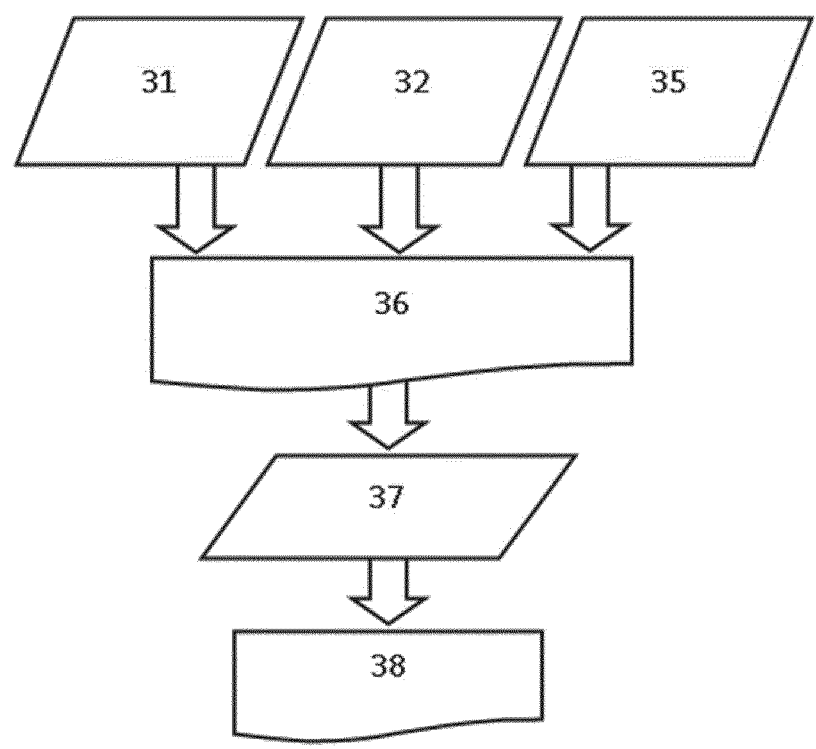
FIG. 2 is a block diagram of simulation models corresponding to the subsystems in FIG. 1, according to an embodiment.

An exemplary flow chart for simulating lithography in a lithographic projection apparatus is illustrated in FIG. 2. A source model 31 represents optical characteristics (including radiation intensity distribution and/or phase distribution) of the source. A projection optics model 32 represents optical characteristics (including changes to the radiation intensity distribution and/or the phase distribution caused by the projection optics) of the projection optics. A design layout model 35 represents optical characteristics (including changes to the radiation intensity distribution and/or the phase distribution caused by a given design layout 33) of a design layout, which is the representation of an arrangement of features on or formed by a patterning device. An aerial image 36 can be simulated from the design layout model 35, the projection optics model 32 and the design layout model 35. A resist image 38 can be simulated from the aerial image 36 using a resist model 37. Simulation of lithography can, for example, predict contours and CDs in the resist image.

More specifically, it is noted that the source model 31 can represent the optical characteristics of the source that include, but not limited to, NA-sigma (σ) settings as well as any particular illumination source shape (e.g. off-axis radiation sources such as annular, quadrupole, and dipole, etc.). The projection optics model 32 can represent the optical characteristics of the of the projection optics that include aberration, distortion, refractive indexes, physical sizes, physical dimensions, etc. The design layout model 35 can also represent physical properties of a physical patterning device, as described, for example, in U.S. Pat. No. 7,587,704, which is incorporated by reference in its entirety. The objective of the simulation is to accurately predict, for example, edge placements, aerial image intensity slopes and CDs, which can then be compared against an intended design. The intended design is generally defined as a pre-OPC design layout which can be provided in a standardized digital file format such as GDSII or OASIS or other file format.

From this design layout, one or more portions may be identified, which are referred to as "clips". In an embodiment, a set of clips is extracted, which represents the complicated patterns in the design layout (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed. In other words, clips may be the portions of the design layout or may be similar or have a similar behavior of portions of the design layout where critical features are identified either by experience (including clips provided by a customer), by trial and error, or by running a full-chip simulation. Clips usually contain one or more test patterns or gauge patterns.

An initial larger set of clips may be provided a priori by a customer based on known critical feature areas in a design layout which require particular image optimization. Alternatively, in another embodiment, the initial larger set of clips may be extracted from the entire design layout by using some kind of automated (such as, machine vision) or manual algorithm that identifies the critical feature areas.

Optical Proximity Correction (OPC) is a photolithography enhancement technique commonly used to compensate for image errors due to diffraction and process effects. Existing model-based OPC usually consists of several steps, including: (i) derive wafer target pattern including rule retargeting, (ii) place sub-resolution assist features (SRAFs), and (iii) perform iterative corrections including model simulation (e.g., by calculating intensity map on a wafer). The most time consuming parts of the model simulation are model-based SRAF generation and cleanup based on mask rule check (MRC), and simulation of mask diffraction, optical imaging, and resist development.

One of the challenges in OPC simulation are runtime and accuracy. Usually, the more accurate the result is, the slower the OPC flow is. To get better process window, more model simulation under different conditions (nominal condition, defocus condition, off-dose condition) are needed in each OPC iteration. Also, the more patterning process related models are included, the more iterations are needed to make the OPC result converge to the target pattern. Because of the large amount of data that needs to be processed (billions of transistors on a chip), the runtime requirement imposes severe constraints on the complexity of the OPC related algorithm. In addition, the accuracy requirements become tighter as the shrink of integrated circuits continues. As such, new algorithms and techniques are needed to address these challenges. For example, a different solution is needed, for example, for polygon-based OPC. The present disclosure provides, for example, methods for determining post OPC layouts. The methods provide high accuracy while maintaining high speed plus the simplicity of the post-OPC layout.

In an embodiment, the present disclosure discusses a method that develops a machine learning model to predict post-OPC images or post-OPC patterns extracted therefrom. The method uses a pre-existing OPC flow to obtain training patterns, collect data comprising a target pattern, a post-OPC pattern, SRAF/SERIF layouts for separate layers of the substrate. This data is used train a machine learning model (e.g., convolutional neural network (CNN)). In an embodiment, to generate training data set, the OPC algorithm can be as complex as needed to get high accuracy data, since number of training patterns is limited compared to full chip.

The present disclosure provides several advantages. The trained model may be applied to predict full-chip post-OPC layout for any target layout/design layout. In an embodiment, the post-OPC layout may be applied for polygon-based correction on target (retarget layer), where the corrections are determined to approximately match the post-OPC layout (determined by the trained model). The corrections can be further used in the existing OPC flow which will require much fewer iterations.

Further advantages of the method include simpler mask layout. Since the post-OPC comes from a polygon-based correction in both an initial step using mask rasterization and later existing OPC correction step, it is easy to apply mask rule check and the mask layout shape will be much simpler. Also, the trained machine learning models of present disclosure lead to faster OPC and SMO results compared to the existing OPC flows.

Figure 3:
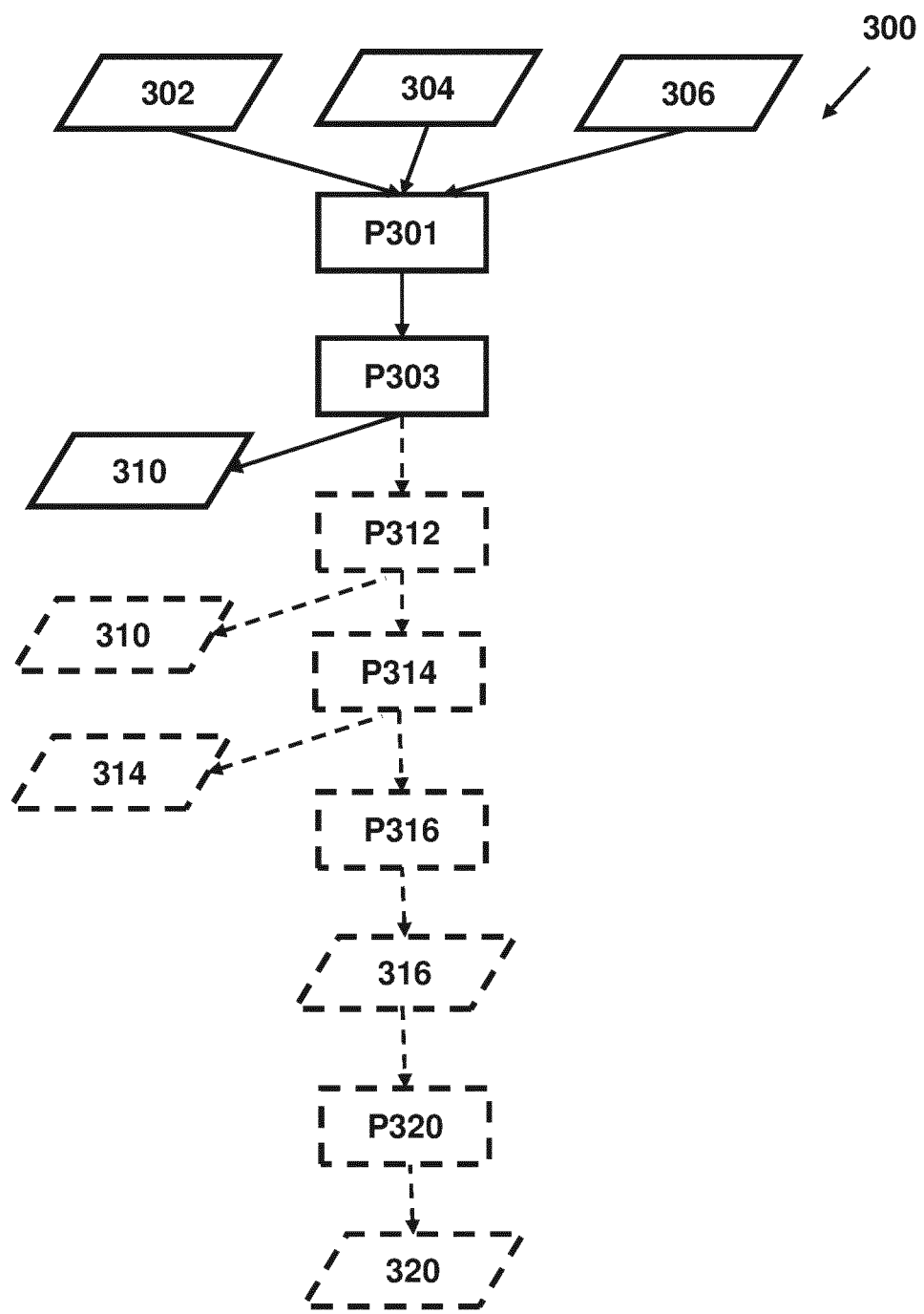
FIG. 3 is a flow chart of a method of training a machine learning model configured to predict a post optimal proximity correction (OPC) image for a mask, according to an embodiment.

FIG. 3 is flow chart of a method 300 of training a machine learning model configured to predict a post optimal proximity correction (OPC) image for a mask. The training is based on image or image data associated with a pre-OPC layout, and assist features. In an embodiment, the pre-OPC layout may be a design layout or a biases design layout. In an embodiment, the pre-OPC data and assist feature data may be separate (e.g., represented as two different images) or in combined form (e.g., in the form of a single image). The model is trained to predict a post-OPC data (e.g., post-OPC image) that closely matches a reference data (e.g., an optimized OPC image). Example processes of the method 300, according to an embodiment, are discussed as follows.

The method, in process P301, involves obtaining (i) a pre-OPC image 302 associated with a design layout to be printed on a substrate, (ii) an image 304 of one or more assist features for the mask associated with the design layout, and (iii) a reference post-OPC image 306 of the design layout. In an embodiment, the pre-OPC image 302, the image of the assist feature, the predicted post-OPC image, and the reference image are pixelated images.

In an embodiment, the obtaining of the pre-OPC image 302 and the image 304 of one or more assist features involves obtaining geometric shapes (e.g., polygon shapes such as square, rectangle, or circular shapes, etc.) of the design layout and the assist features, and generating, via image processing, the pre-OPC image 302 from the geometric shapes of the design layout and another image from geometric shapes of the assist features. In an embodiment, the image processing comprises a rasterization operation based on the geometric shapes. For example, the rasterization operation that converts the geometric shapes (e.g. in vector graphics format) to a pixelated image. In an embodiment, the rasterization may further involve applying a low-pass filter to clearly identify feature shapes and reduce noise.

In an embodiment, the obtaining of geometric shapes of the assist features involves determining, via a rule-based approach, geometric shapes of assist features associated with the design layout. In an embodiment, determining, via a model-based approach, geometric shapes of assist features associated with the design layout. Example ways to obtain SRAFs (e.g., rule-based or model-based) are discussed in U.S. patent application Ser. No. 14/282,754, filed on May 20, 2014, and U.S. Pat. No. 7,882,480, filed on Jun. 4, 2007, which are incorporated herein by reference in its entirety.

In an embodiment, the obtaining of the reference image involves performing a mask optimization process and/or a source mask optimization process using the design layout. In an embodiment, the mask optimization process employs optical proximity correction process. Example OPC processes are further discussed with respect to FIGS. 10-13.

The method, in process P303, involves training the machine learning model using the pre-OPC image 302 and the image 304 of one or more assist features as input such that a difference between the reference image and a predicted post-OPC image of the machine learning model is reduced. At the end of the training process, a trained machine learning model 310 (also referred as a trained second model 310).

In an embodiment, the training of the machine learning model is an iterative process, an iteration involves inputting the pre-OPC image 302 and the image 304 of one or more assist features to the machine learning model; predicting the post-OPC image 302 by simulating the machine learning model; determining the difference between the predicted post-OPC image and the reference image; and adjusting weights of the machine learning model such that the difference between the predicted and reference images is reduced.

In an embodiment, the adjusting the weights is based on a gradient decent of the difference. In an embodiment, the weights may be adjusted based on other optimization methods that minimizes the difference. It can be understood by a person skilled in the art that the present disclosure is not limited to gradient decent method, and other appropriate approaches may be used that can guide how to adjust weights so that the difference between the predicted image and the reference image is reduced. In an embodiment, training is performed until the difference between the predicted image and the reference image is minimized.

Figure 4A:
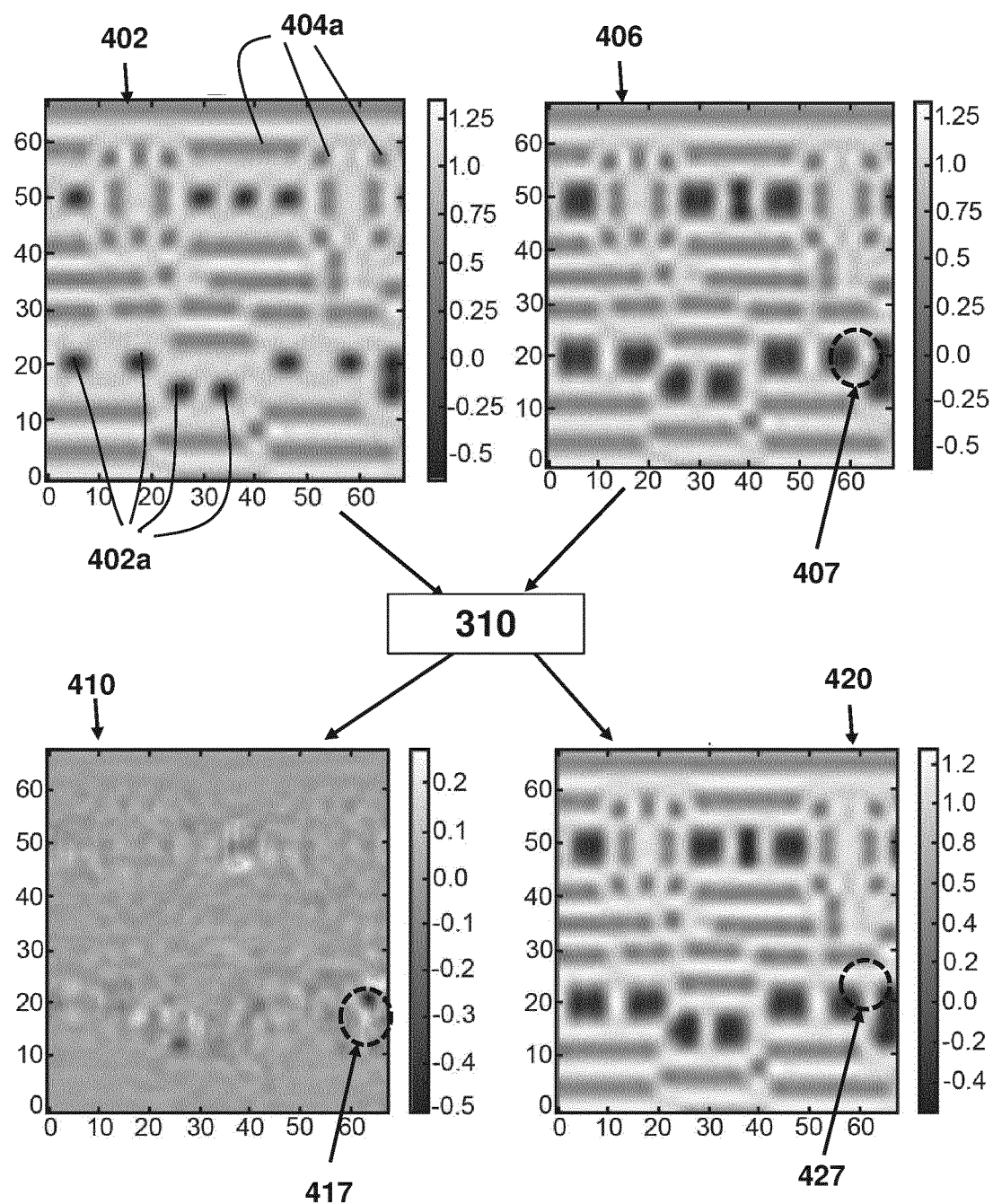
FIG. 4A is an example of a training data set and results of the training method of FIG. 3, according to an embodiment.

FIG. 4A illustrates an example of a training set and results of the training method 300, where a machine learning model (e.g., also referred as a second machine learning model) is trained to determine/predict a predicted post-OPC image (e.g., 420). In the present example, the training set comprises an image 402 that includes features 402*a* associated with primary features of a design layout, as well as assist features (SRAF) 404*a* associated with the primary features of the design layout. Thus, in the present example, the image 402 is a combination of a pre-OPC image and an image of assist features. Further, a reference image 406 (e.g., an optimized post-OPC image obtained via several iterations of complex OPC simulations) is used as ground truth for modifying the weights of the machine learning model during the training process.

During the training process, the weights are modified such that a difference 410 between the reference image 406 and the predicted post-OPC image (e.g., 420) is iteratively reduced. In an embodiment, the weights are modified based on a gradient decent method (not illustrated), where a gradient map is computed based on a differential of the difference 410. The gradient map of the difference 410 serves as a guide to modify weights of the machine learning model such that the difference is reduced (in an embodiment, minimized after several iterations). Thus, in an embodiment, the model is considered as the trained machine learning model 310 when the difference between the reference image 406 and the predicted-OPC image 420 is minimized. In other words, the training process (or simulation) converges and there is no further improvement in the difference 410, thereby a results of the trained model 310 closely matches with the reference image 406.

In an embodiment, the predicted post-OPC image may not exactly match the reference image 406. For example, at a location 407 in the reference image 406, a relatively greater difference 417 is observed. Such difference 417 indicates, at such location, the predicted post-OPC image includes features that substantially, but not visibly, different. However, even with such difference 417, the predicted post-OPC image 420 enables reducing of the number of iterations (e.g., less than 10 iterations compared to 1000 iterations when only the design layout is used) of the OPC simulation process to further improve the post-OPC layout of the design layout. In other words, when the predicted post-OPC image 420 is used as an initial or starting point for the OPC simulation, the OPC simulation runs and converges much faster, thereby saving computational time and resources.

Figure 4B:
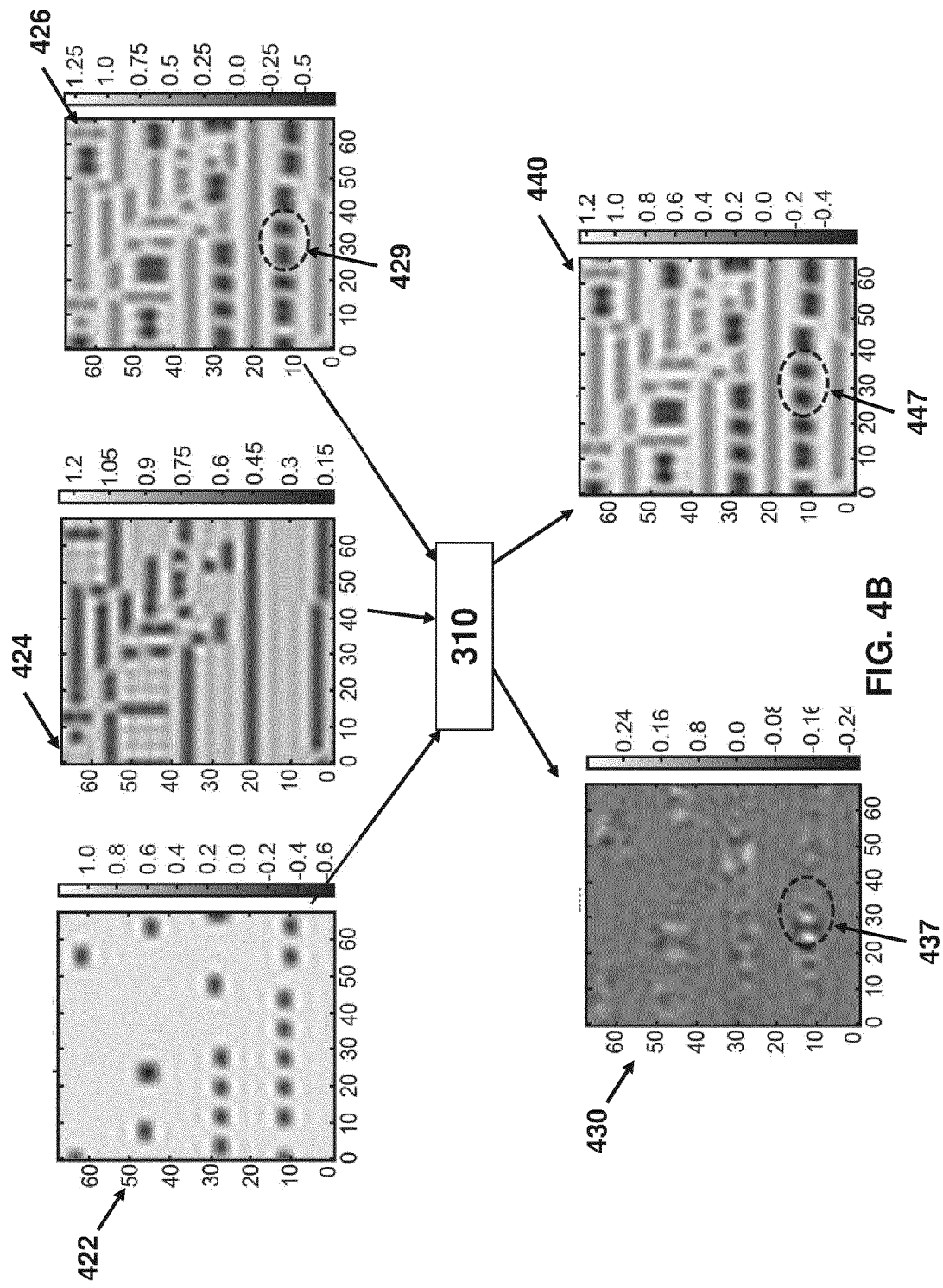
FIG. 4B is another example of a training data set and results of the training method of FIG. 3, according to an embodiment.

FIG. 4B illustrates another example of a training set and results of the training method 300, where a machine learning model (e.g., the second machine learning model) is trained to determine/predict a predicted post-OPC image (e.g., 430). In the present example, a pre-OPC image 422 and an assist feature image 424 are separate. In an embodiment, as discussed earlier, the pre-OPC image 422 may be obtained via rasterization of a design layout. The assist feature image 424 may be obtained via rasterization of SRAFs (e.g., geometric shapes of SRAFs) associated with the design layout. In an embodiment, such SRAFs may be obtained via SRAF guidance map, SRAF rules, or model-based OPC approach, as mentioned earlier. Further, a reference image 426 (e.g., an optimized post-OPC image obtained via several iterations of complex OPC simulations) is used as ground truth for modifying the weights of the machine learning model during the training process. The training process is similar to that discussed in FIG. 3 and FIG. 4A above. During the training process, the weights are modified such that a difference 430 between the reference image 426 and the predicted post-OPC image (e.g., 440) is iteratively reduced (in an embodiment, minimized after several iterations).

Similar to above discussion, the predicted post-OPC image 440 may not exactly match the reference image 426. For example, at a location 429 in the reference image 426, a relatively greater difference 447 is observed. Such difference 447 indicates that at such location the predicted post-OPC image 440 includes features that substantially, but not visibly, different. Even so, the predicted post-OPC image 440 enables reducing the number of iterations (e.g., less than 10 iterations compared to 1000 iterations when only the design layout is used) of the OPC simulation process to further improve the post-OPC layout of the design layout. In other words, the OPC simulation runs and converges faster with the predicted image 420, thereby saving computational time and resources.

Referring back to FIG. 3, the method 300 may further involve a mask model correction process that involves determining corrections 316 to a design layout based on the trained machine learning model. For example, the method further involves process P312-P316 discussed as follows. Process P312 involves obtaining geometric shapes 312 of the design layout. For example, geometric shapes 312 may be a rectangle having a desired CD value (e.g., length and width), a square having a desired CD value, a contact hole (e.g., a circle) having a desired CD values (e.g., diameter), or other geometric shapes. In an embodiment, such geometric shapes are available in the GDS file used in patterning process simulation.

Process P314 involves dissecting the geometric shapes 312 of the design layout (or a pre-OPC layout in general) into a plurality of segments 314. The dissecting of geometric shapes refers to dividing the geometric shapes in smaller segments or pieces so that the individual segments or pieces can be moves relative to other segments or pieces. For example, a line may be divided into 3 segments of similar length. The dissecting of the geometric shape may be such that each segment is of similar length. However, the present disclosure is not limited to a particular dissection approach (e.g., equal length or unequal lengths). An example of dissected geometric shape is show in FIG. 9, discussed later.

Process P316 involves determining corrections 316 to the plurality of segments 314 such that a difference between an image associated with the design layout and the predicted post-OPC image along the geometric shapes is reduced. In an embodiment, corrections 316 refers to a geometric property of the segment or relative property with respect to other segments. For example, the corrections may be an amount of distance (e.g., 2 nm in upward direction) a particular segment is moved with respect to other segments. In an embodiment, the correction may be with reference to an angular position, or a curvature of the segments. In an embodiment, the corrections (e.g., distance, angle, direction, radius of curvature) are associated with each segment that can be stored and further used during an optimization process (e.g., in OPC).

In an embodiment, the determining of the corrections 316 is an iterative process, an iteration involves adjusting (e.g., distance, length, radius of curvature, angle) the plurality of segments 314 of the geometric shapes 312; generating (e.g., using rasterization operation) an image from the adjusted geometric shapes of the design layout; and evaluating the difference between the generated image and the predicted post-OPC image along the geometric shapes within the respective images.

In an embodiment, the images are pixelated images and the difference between the generated and predicted images is a difference in intensity values along the geometric shapes. In an embodiment, the pixel values along or relatively close to the geometric shapes may be used to determine the difference.

In an embodiment, the adjusting the plurality of the segments 314 involves adjusting shape and/or position of at least a portion of the plurality of segments such that the difference between the generated and predicted images is reduced. In an embodiment, the difference between the generated image and the predicted post-OPC image is minimized. In an embodiment, the adjustments or corrections 316 may result in substantial modification or an original geometric shape of a design layout. In other words, the original shape is not preserved.

In an embodiment, the process P316 may involve placing one or more evaluation points on each segment of a plurality of segments. An evaluation point is locations in a segment at which a metric (e.g., EPE) is evaluated. In an embodiment, a sum of the values of the metric at each evaluation point may be evaluated and adjustments to the segments may be performed so that the sum of the metric is reduced (in an embodiment, minimized).

The method 300 may be further extended to use the trained model 310 and the correction 316 to perform OPC simulations. For example, process P320 involves determining, via OPC simulation using the design layout and the corrections 316 to the design layout, a mask layout 320 to be used for manufacturing the mask for a patterning process.

In an embodiment, the OPC simulation involves determining, via simulating a patterning process model using the geometric shapes 312 of the design layout and the corrections 316 associated with the plurality of segments 316, a simulated pattern that will be printed on a substrate; and determining optical proximity corrections to the design layout such that a difference between the simulated pattern and the design layout is reduced.

In an embodiment, the determining optical proximity corrections is an iterative process, an iteration involves adjusting the shapes and/or sizes of polygons associated with primary features of the design layout and/or the assist features such that a performance metric of the patterning process is reduced. In an embodiment, the assist features are extracted from the predicted post-OPC image of the machine learning model. In an embodiment, the performance metric comprises an edge placement error between the simulated pattern and the design layout, and/or CD values of the simulated pattern. Other example OPC simulation process are further discussed with respect to FIGS. 10-13 later in the disclosure.

Figure 5:
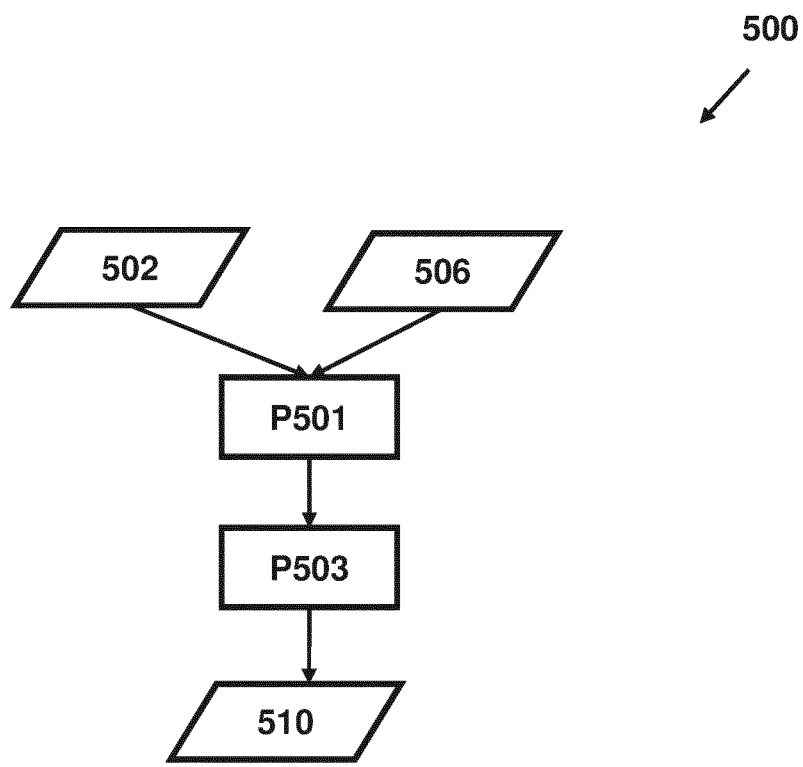
FIG. 5 is a flow chart of another method of training another machine learning model configured to predict a post optimal proximity correction (OPC) image for a mask, according to an embodiment.

FIG. 5 is a method for training another machine learning model (also referred as a first machine learning model) to predict a post optimal proximity correction (OPC) used for designing a mask.

The method, in process P501, involves obtaining (i) a pre-OPC image 502 associated with a design layout to be printed on a substrate, and (ii) a reference post-OPC image 506 of the design layout. In an embodiment, the obtaining of the pre-OPC image is similar to that discussed in method 300 that involves obtaining geometric shapes of the design layout; and generating, via image processing, an image from the geometric shapes. In an embodiment, the image processing comprises rasterization operation using the geometric shapes, as discussed earlier.

In an embodiment, the obtaining of the reference post-OPC image 506 is similar to that discussed in method 300. For example, the reference image 506 is obtained by performing a mask optimization process and/or a source mask optimization process using the design layout. In an embodiment, the mask optimization process comprises optical proximity corrections.

The method, in process P503, involves training the machine learning model using the pre-OPC image 502 as input such that a difference between a predicted post-OPC image of the machine learning model and the reference image 506 is reduced.

In an embodiment, the training of the machine learning model is an iterative process, an iteration involves inputting the pre-OPC image 502 to the machine learning model; predicting the post-OPC image by simulating the machine learning model; determining the difference between the predicted post-OPC image and the reference image; and adjusting weights of the machine learning model such that the difference between the predicted and the reference images is reduced (in an embodiment, minimized). In an embodiment, the adjusting the weights is based on a gradient decent of the difference.

Figure 6A:
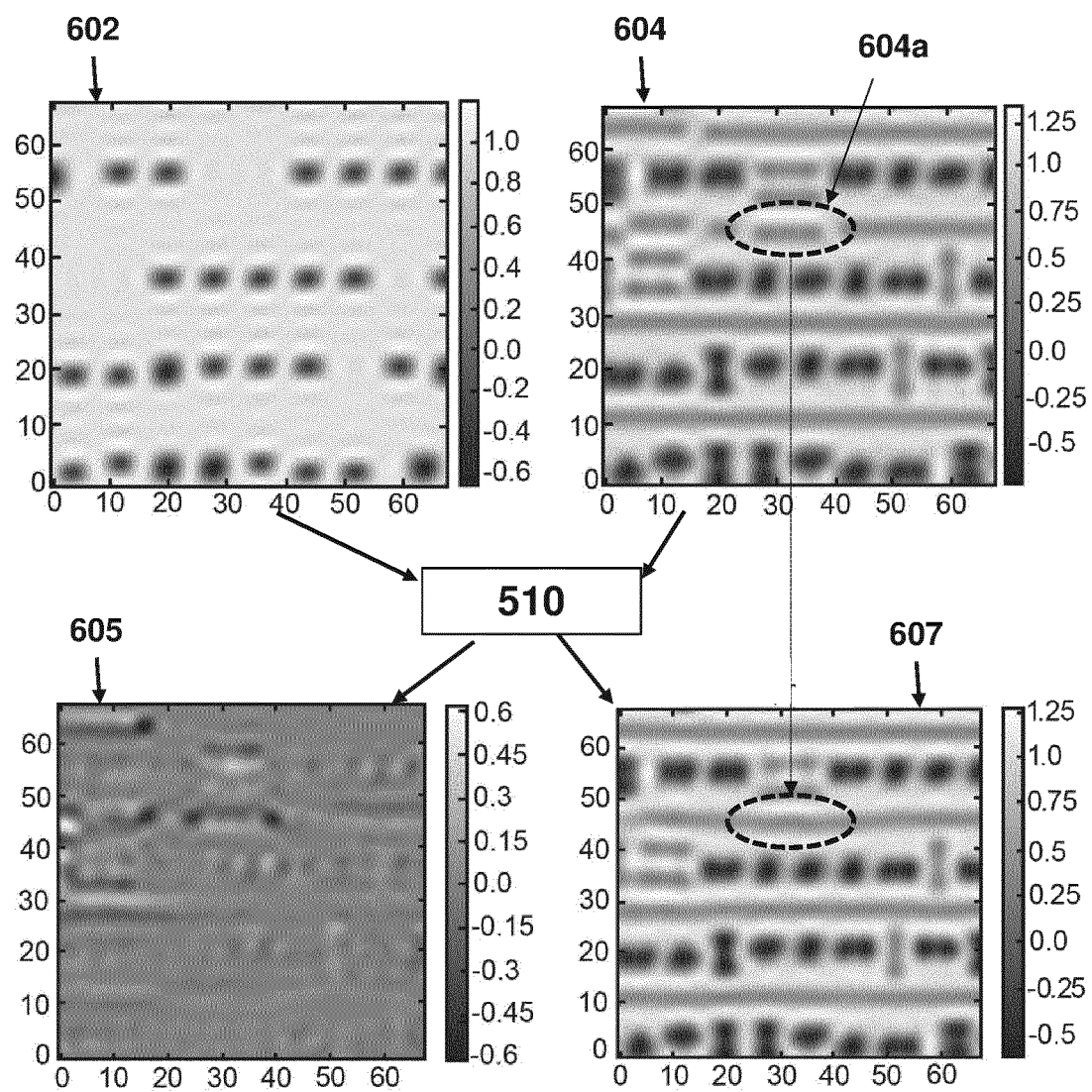
FIGS. 6A, 6B, and 6C illustrate examples of training sets and results of the training method of FIG. 5, according to an embodiment.
Figure 6B:
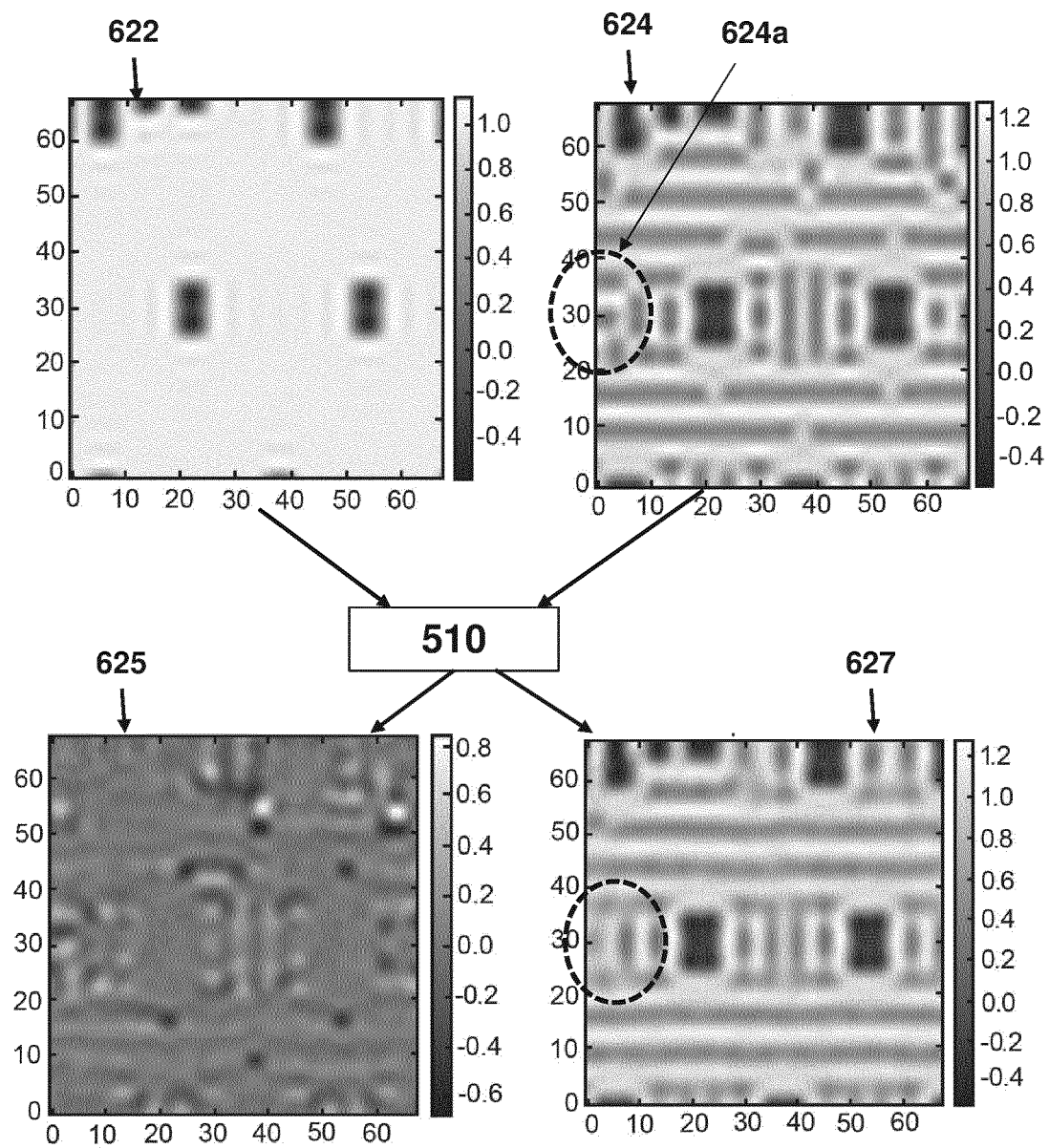
Figure 6C:
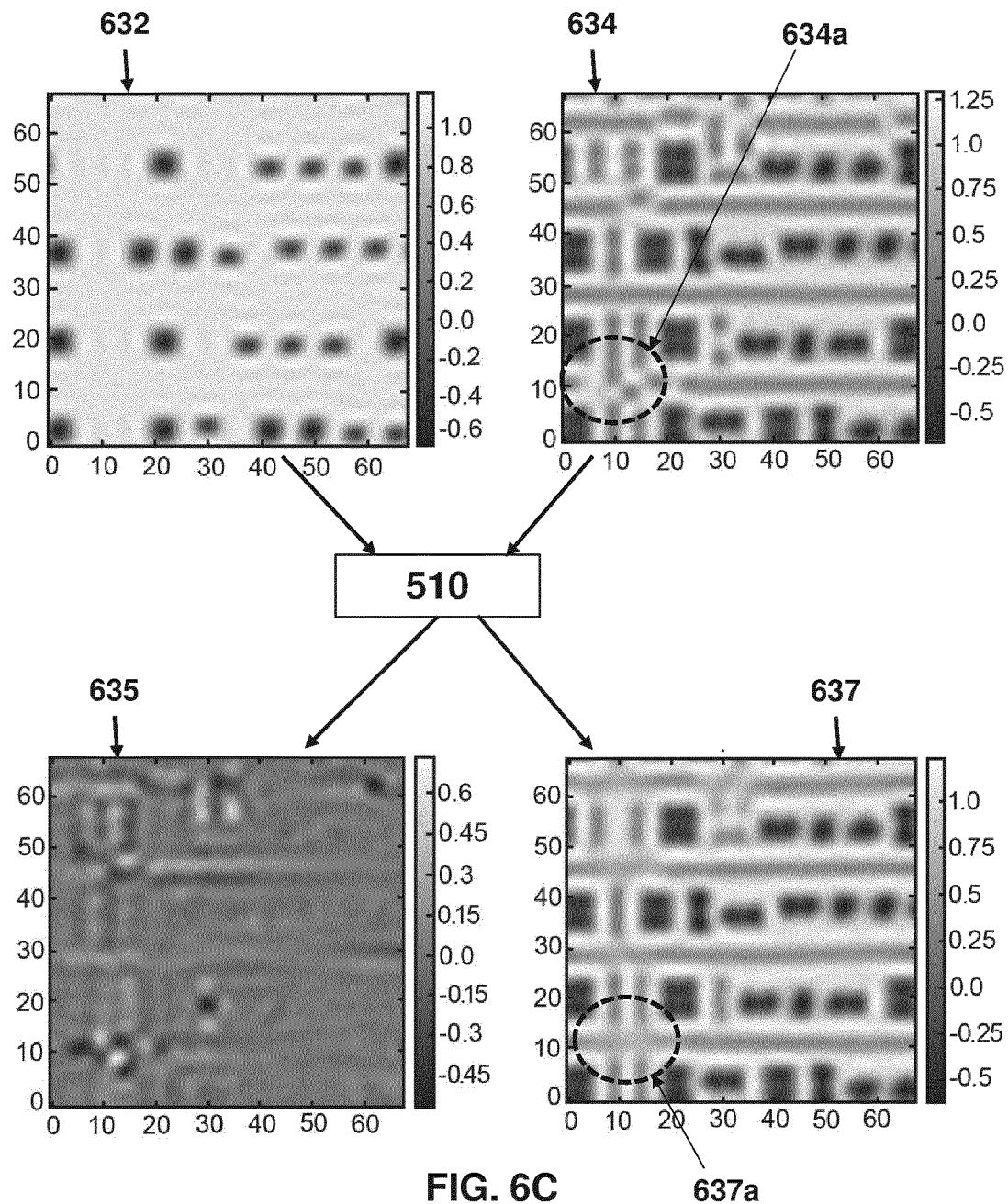

FIGS. 6A, 6B, and 6C illustrate examples of a training set and results of the training method 500, where a machine learning model (e.g., the first machine learning model) is trained to determine/predict a predicted post-OPC image (e.g., 607, 627, and 637). In the present example, the training set comprises a pre-OPC image (e.g., 602, 622, and 632 in FIGS. 6A-6C respectively) that includes features associated with primary features of a design layout, but no assist features (e.g., SRAFs). Further, a reference image (e.g., 604, 624, and 634 associated with 602, 622, and 632 respectively) is used as ground truth for modifying the weights of the machine learning model during the training process. In an embodiment, the reference image is an optimized post-OPC image obtained via several iterations of complex OPC simulations using a design layout of interest.

During the training process (e.g., of method 500), the weights of the machine learning model (e.g., also referred as the first machine learning model) are modified such that a difference (e.g., 605, 625, and 635) between the reference image (e.g., 604, 624, and 634) and the predicted post-OPC image (e.g., 607, 627, and 637) is iteratively reduced. In an embodiment, as mentioned earlier, the weights are modified based on a gradient decent method (not illustrated). Thus, in an embodiment, the model is considered as the trained machine learning model 510 when the difference between the reference image and the predicted-OPC image is minimized. In other words, the training process (or simulation) converges and there is no substantial improvement in the difference (e.g., 605, 625, and 635).

Similar to above discussion (with respect to FIGS. 4A and 4B), the predicted post-OPC image 607/627/637 may not exactly match the reference image 604/624/634. For example, at a location 604a/624a/634a in the reference image 604/624/634, a relatively greater difference is observed. Such difference indicates that at such location the predicted post-OPC image includes features that substantially, in some cases visibly, different. Even so, the predicted post-OPC image 607/627/637 enables reducing the number of iterations of the OPC simulation process to further improve the post-OPC layout of the design layout. In other words, the OPC simulation runs and converges faster with the predicted image 607/627/637, thereby saving computational time and resources. As mentioned above, the predicted post-OPC image 607/627/637 can be converted to, example, a GDS format, by extracting primary and assist features from the image 440, and such GDS file is then used in the OPC simulation.

In an embodiment, the trained machine learning model 510 generates simpler SRAFs which may be highly desired as such simpler SRAFs are easy to manufacture. For example, at location 624a in FIG. 6C, the several small and discrete SRAFs are placed relatively closely to each other. On the other hand, at location 637a (corresponding to 624a), simpler SRAFs are generated that are straight and less discrete. Such straighter SRAFs are advantageous from mask manufacturing point of view.

Referring to FIGS. 4A-4B and 6A-6C, it can be observed that the predicted post-OPC image 607/627/637 (also referred as a first predicted OPC-image) are visibly different from the reference image 604/624/634. On the other hand, the predicted post-OPC image 420/430 more closely matches the reference image 406/426.

In an embodiment, the first post-OPC images 607/627/637 includes SRAFs associated with primary features. Such SRAFs may be extracted and further used as input to the trained second machine learning model (e.g., 310) to predict second post-OPC images. Such second post-OPC images may be further improvements than SRAFs obtained via existing approaches such as rule-based and model-based. Further, the use of the trained first machine learning model (e.g., 510) to obtain SRAFs may be much faster than existing approaches. An example method employing the trained models 510 and 310 is discussed with respect to FIG. 7 below.

Figure 7:
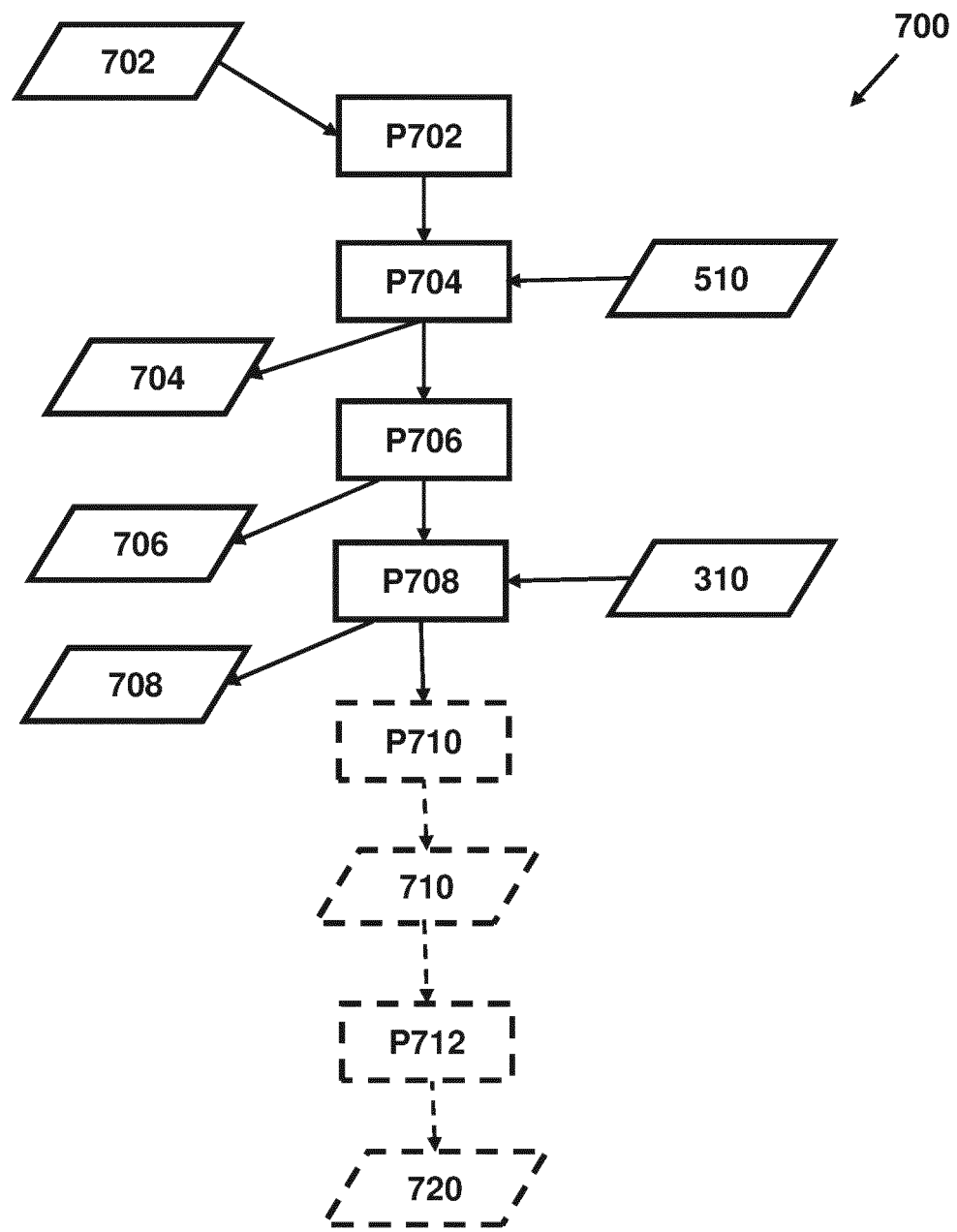
FIG. 7 is a method for determining a post-OPC image for a mask using a trained first machine learning model of FIG. 5 and a trained second machine learning model of FIG. 3, according to an embodiment.

FIG. 7 is flow chart of a method 700 for determining a post-OPC image for a mask. The method, in process P702, involves obtaining a pre-OPC image 702 associated with the design layout. The pre-OPC image 702 is obtained in a similar manner as discussed in method 300 and 500 before. The method, in process P704, determining a first post-OPC image 704 of the mask by executing a trained first machine learning model (e.g., 510) using the pre-OPC image 702, wherein the first post-OPC image 704 comprises assist features for the mask. Further, process P706 involves extracting geometric shapes 706 of the assist features of the first post-OPC image.

The method, in process P708, determining a second post-OPC image 708 for the mask by simulating a trained second machine learning model (e.g., 310) using the pre-OPC image 702 of the design layout and the extracted geometric shapes 706 of the assist features of the first post-OPC image 704.

In an embodiment, the method 700 may be further extended to determine corrections to design layout as discussed earlier in FIG. 3. In an embodiment, process P710 involves determining, based on the second post-OPC image 708 and the design layout, corrections 710 to the design layout.

In an embodiment, as discussed earlier, the determining of the corrections 710 is an iterative process, an iteration involves obtaining geometric shapes of the design layout, dissecting the geometric shapes of the design layout into a plurality of segments, adjusting the plurality of segments, generating an image from the adjusted geometric shapes of the design layout, and evaluating the difference between the generated image and the second post-OPC image 708 along the geometric shapes of the respective images.

In an embodiment, the adjusting of the plurality of the segments involves adjusting shape and/or position of at least a portion of the plurality of segments such that the difference between the generated image and the second post-OPC image 708 along the geometric shapes of the respective images is reduced (in an embodiment, minimized).

The method 700 may be further extended to perform OPC simulation. For example, process P712 involves determining, via OPC simulation using the design layout and the corrections 710 to the design layout, a mask layout 720 to be used for manufacturing the mask for a patterning process.

Figure 8:
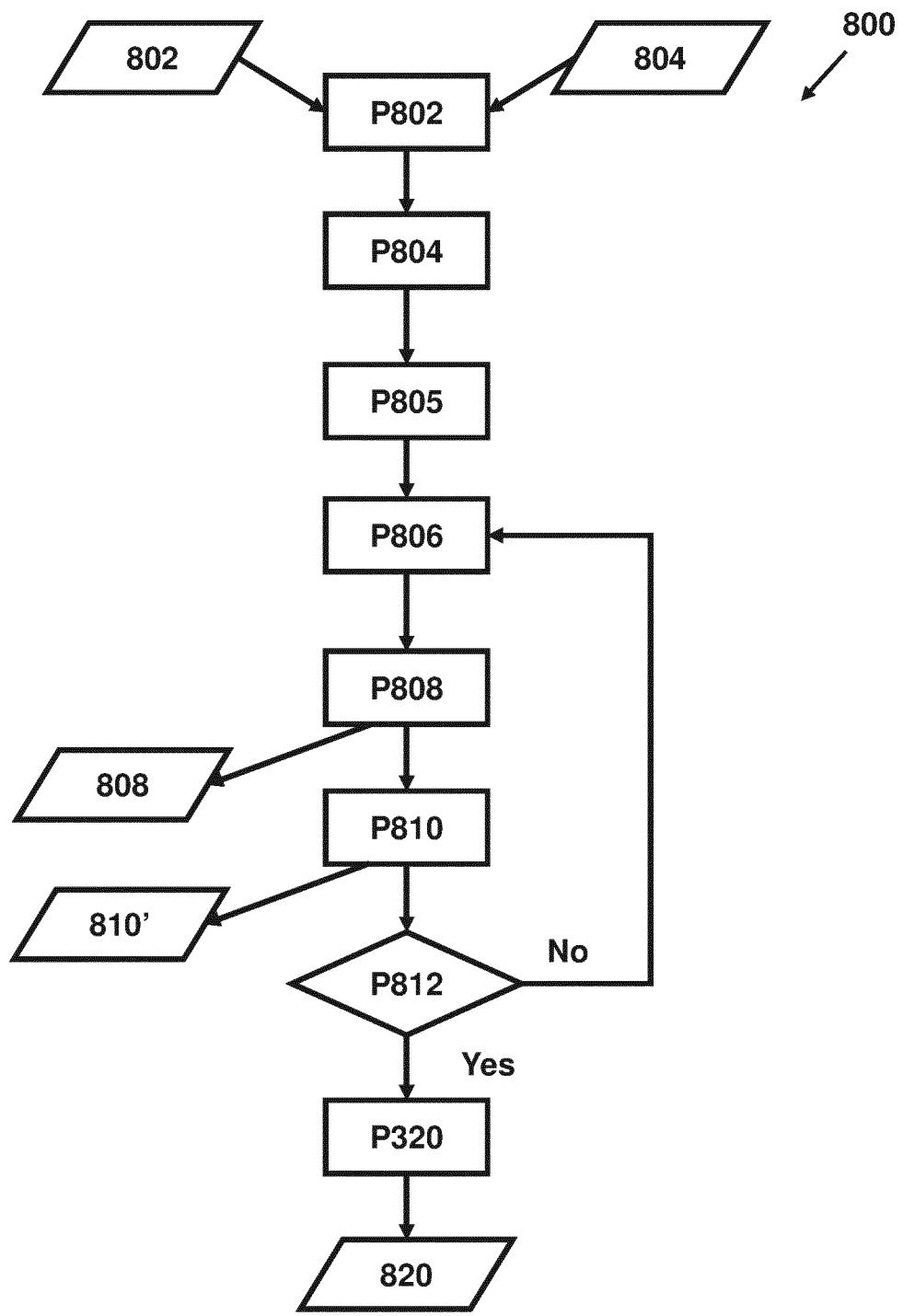
FIG. 8 is a flow chart of a method for determining corrections to a design layout, according to an embodiment.

FIG. 8 is an example method 800 for determining corrections to a design layout, similar to that discussed with respect to FIG. 3 above.

The method, in process P802, involves obtaining (i) a predicted post-OPC image 802 via a training machine learning model that uses a pre-OPC image of the design layout and an image of the one or more assist features associated with the design layout, and (ii) geometric shapes 804 of the design layout.

The method, in process P804, involves dissecting the geometric shapes of the design layout into a plurality of segments. Further, the method involves, as discussed below, determining corrections 810 to the plurality of segments such that a difference between an image of the design layout and the predicted post-OPC image along the geometric shapes is reduced.

The method, in process P805, placing one or more evaluation points on each segment of a plurality of segments, as discussed earlier with respect to the method 300.

In an embodiment, the determining of the corrections 810 is an iterative process, an iteration involves process P806, P808, and P810.

Process P806 involves adjusting, via the one or more evaluation points, the plurality of segments. Process P808 involves generating an image from the adjusted geometric shapes of the design layout. Process P810 involves evaluating the difference between the generated image 808 and the predicted post-OPC image 802 at the one or more evaluation points on the plurality of segments of the geometric shapes. In an embodiment, the difference between the generated and predicted images is a difference in intensity values at the one or more evaluation points. In an embodiment, process P812 determines whether the difference is minimized. If not, the process continues adjusting the segments in process P806.

In an embodiment, in the process P806, the adjusting the plurality of the segments involves adjusting shape and/or position of at least a portion of the plurality of segments such that the difference between the generated and predicted images is reduced.

In an embodiment, when the process P812 determines that difference between the generated image and the predicted post-OPC image is minimized, the correction process stops. At end of the iterations, the corrections 810 is obtained with respect each segment of the plurality of segments.

Figure 9:
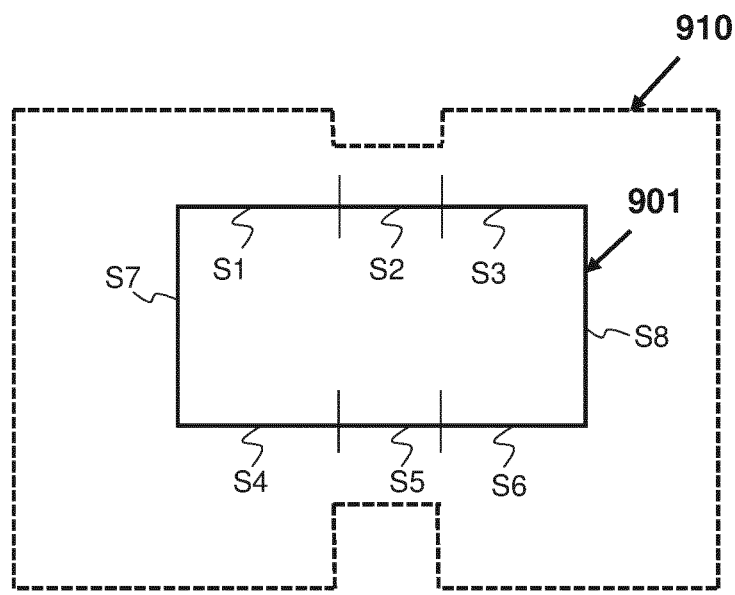
FIG. 9 is an example result of the mask correction process of FIG. 7, according to an embodiment.

FIG. 9 is an example of result mask correction process as discussed in method 700 (which can also be applied in methods 300 and 500). For example, a feature 901 is a part of a design layout, where the feature 901 has a rectangular geometric shape. In an embodiment, the geometric shape is divided (or dissected) into a plurality of segments S1, S2, S3, S4, S5, S6, S7, and S8. These segments S1-S8 are modified based on the predicted post-OPC image (e.g., the first predicted post-OPC image, or a second predicted post-OPC image mentioned earlier) or geometric shapes of features therein. For example, the segments S1, S2, and S3 of the feature 901 of the design layout are moved upwards in different manner. For example, S1 and S3 is moved relatively further than the segment S2. Similarly, segments S4-S7 are moved independently as well.

Each movement of the segments S1-S7 results in a different geometric shape, which when used to generate an image (e.g., via rasterization) will have different pixel intensities along the geometric shapes. This generated image is compared with the predicted post-OPC images (as discussed in method 700) to reduce a difference between the images. After several iterations, as discussed in method 700, a final position of the segments S1-S7 is obtained and the corresponding geometric shape 910 can be used as a part of a mask layout, which is further used to produce a mask to be used in the patterning process to print a design layout.

Since, the corrections to the design layout are performed with respect to the predicted post-OPC image, instead of an existing OPC simulation process, resulting the mask layout is obtained orders of magnitude faster than an existing OPC simulation process. Thereby, such corrections not only provide accurate solutions of for designing a mask layout, but also reduces computational time and resources compared to existing OPC simulation methods.

In an embodiment, the method 800 can be further extended to perform OPC simulation (e.g., Process P320) using the corrections 810 determined above to further improve post-OPC results of the OPC simulation at a much faster rate, since the simulation process is initialized with corrections that are already close to final post-OPC results (e.g., predicted post-OPC). In an embodiment, the method involves determining, via OPC simulation using the design layout and the corrections to the design layout, a mask layout 820. In an embodiment, the OPC simulation involves determining, via simulating a patterning process using the geometric shapes of the design layout and the corrections associated with the plurality of segments of the geometric shapes, a simulated pattern that will be printed on a substrate; and determining optical proximity corrections to the design layout such that a difference between the simulated pattern and the design layout is reduced.

In an embodiment, the determining optical proximity corrections is an iterative process, an iteration involves adjusting the shapes and/or sizes of polygons associated with primary features of the design layout and/or the assist features such that a performance metric of the patterning process is reduced. In an embodiment, the assist features are extracted from the predicted post-OPC image of the machine learning model.

In an embodiment, the performance metric comprises an edge placement error between the simulated pattern and the design layout, and/or CD values of the simulated pattern.

In an embodiment, the corrections and post-OPC images determined according to the methods 300, 500, 700, and/or 800, may be employed in optimization of patterning process or adjusting parameters of the patterning process. As an example, OPC addresses the fact that the final size and placement of an image of the design layout projected on the substrate will not be identical to, or simply depend only on the size and placement of the design layout on the patterning device. It is noted that the terms "mask", "reticle", "patterning device" are utilized interchangeably herein. Also, person skilled in the art will recognize that, especially in the context of lithography simulation/optimization, the term "mask"/"patterning device" and "design layout" can be used interchangeably, as in lithography simulation/optimization, a physical patterning device is not necessarily used but a design layout can be used to represent a physical patterning device. For the small feature sizes and high feature densities present on some design layout, the position of a particular edge of a given feature will be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during post-exposure bake (PEB), resist development, and etching that generally follow lithography.

In order to ensure that the projected image of the design layout is in accordance with requirements of a given target circuit design, proximity effects need to be predicted and compensated for, using sophisticated numerical models, corrections or pre-distortions of the design layout. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the design layout has some modification in order to achieve high fidelity of the projected image to the target design. These modifications may include shifting or biasing of edge positions or line widths as well as application of "assist" features that are intended to assist projection of other features.

Application of model-based OPC to a target design involves good process models and considerable computational resources, given the many millions of features typically present in a chip design. However, applying OPC is generally not an "exact science", but an empirical, iterative process that does not always compensate for all possible proximity effect. Therefore, effect of OPC, e.g., design layouts after application of OPC and any other RET, need to be verified by design inspection, i.e. intensive full-chip simulation using calibrated numerical process models, in order to minimize the possibility of design flaws being built into the patterning device pattern. This is driven by the enormous cost of making high-end patterning devices, which run in the multi-million dollar range, as well as by the impact on turn-around time by reworking or repairing actual patterning devices once they have been manufactured.

Both OPC and full-chip RET verification may be based on numerical modeling systems and methods as described, for example in, U.S. patent application Ser. No. 10/815,573 and an article titled "Optimized Hardware and Software For Fast, Full Chip Simulation", by Y. Cao et al., Proc. SPIE, Vol. 5754, 405 (2005).

One RET is related to adjustment of the global bias of the design layout. The global bias is the difference between the patterns in the design layout and the patterns intended to print on the substrate. For example, a circular pattern of 25 nm diameter may be printed on the substrate by a 50 nm diameter pattern in the design layout or by a 20 nm diameter pattern in the design layout but with high dose.

In addition to optimization to design layouts or patterning devices (e.g., OPC), the illumination source can also be optimized, either jointly with patterning device optimization or separately, in an effort to improve the overall lithography fidelity. The terms "illumination source" and "source" are used interchangeably in this document. Since the 1990s, many off-axis illumination sources, such as annular, quadrupole, and dipole, have been introduced, and have provided more freedom for OPC design, thereby improving the imaging results, As is known, off-axis illumination is a proven way to resolve fine structures (i.e., target features) contained in the patterning device. However, when compared to a traditional illumination source, an off-axis illumination source usually provides less radiation intensity for the aerial image (AI). Thus, it becomes desirable to attempt to optimize the illumination source to achieve the optimal balance between finer resolution and reduced radiation intensity.

Numerous illumination source optimization approaches can be found, for example, in an article by Rosenbluth et al., titled "Optimum Mask and Source Patterns to Print A Given Shape", Journal of Microlithography, Microfabrication, Microsystems 1(1), pp. 13-20, (2002). The source is partitioned into several regions, each of which corresponds to a certain region of the pupil spectrum. Then, the source distribution is assumed to be uniform in each source region and the brightness of each region is optimized for process window. However, such an assumption that the source distribution is uniform in each source region is not always valid, and as a result the effectiveness of this approach suffers. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations. Though these methods have demonstrated some successes, they typically require multiple complicated iterations to converge. In addition, it may be difficult to determine the appropriate/optimal values for some extra parameters, such as γ in Granik's method, which dictates the trade-off between optimizing the source for substrate image fidelity and the smoothness requirement of the source.

For low $k_1$ photolithography, optimization of both the source and patterning device is useful to ensure a viable process window for projection of critical circuit patterns. Some algorithms (e.g. Socha et. al. Proc. SPIE vol. 5853, 2005, p. 180) discretize illumination into independent source points and mask into diffraction orders in the spatial frequency domain, and separately formulate a cost function (which is defined as a function of selected design variables) based on process window metrics such as exposure latitude which could be predicted by optical imaging models from source point intensities and patterning device diffraction orders. The term "design variables" as used herein comprises a set of parameters of a lithographic projection apparatus or a lithographic process, for example, parameters a user of the lithographic projection apparatus can adjust, or image characteristics a user can adjust by adjusting those parameters. It should be appreciated that any characteristics of a lithographic projection process, including those of the source, the patterning device, the projection optics, and/or resist characteristics can be among the design variables in the optimization. The cost function is often a non-linear function of the design variables. Then standard optimization techniques are used to minimize the cost function.

Relatedly, the pressure of ever decreasing design rules have driven semiconductor chipmakers to move deeper into the low $k_1$ lithography era with existing 193 nm ArF lithography. Lithography towards lower $k_1$ puts heavy demands on RET, exposure tools, and the need for litho-friendly design.

1.35 ArF hyper numerical aperture (NA) exposure tools may be used in the future. To help ensure that circuit design can be produced on to the substrate with workable process window, source-patterning device optimization (referred to herein as source-mask optimization or SMO) is becoming a significant RET for 2× nm node.

A source and patterning device (design layout) optimization method and system that allows for simultaneous optimization of the source and patterning device using a cost function without constraints and within a practicable amount of time is described in a commonly assigned International Patent Application No. PCT/US2009/065359, filed on Nov. 20, 2009, and published as WO2010/059954, titled "Fast Freeform Source and Mask Co-Optimization Method", which is hereby incorporated by reference in its entirety.

Another source and mask optimization method and system that involves optimizing the source by adjusting pixels of the source is described in a commonly assigned U.S. patent application Ser. No. 12/813,456, filed on Jun. 10, 2010, and published as U.S. Patent Application Publication No. 2010/0315614, titled "Source-Mask Optimization in Lithographic Apparatus", which is hereby incorporated by reference in its entirety.

In a lithographic projection apparatus, as an example, a cost function is expressed as $$CF(z_1, z_2, \ldots, z_N) = \sum_{p=1}^{P} w_p f_p^2(z_1, z_2, \ldots, z_N) \quad \text{(Eq. 1)}$$

wherein $(z_1, z_2, \ldots, z_N)$ are N design variables or values thereof. $f_p(z_1, z_2, \ldots, z_N)$ can be a function of the design variables $(z_1, z_2, \ldots, z_N)$ such as a difference between an actual value and an intended value of a characteristic at an evaluation point for a set of values of the design variables of $(z_1, z_2, \ldots, z_N)$. $w_p$ is a weight constant associated with $f_p(z_1, z_2, \ldots, z_N)$. An evaluation point or pattern more critical than others can be assigned a higher $w_p$ value. Patterns and/or evaluation points with larger number of occurrences may be assigned a higher $w_p$ value, too. Examples of the evaluation points can be any physical point or pattern on the substrate, any point on a virtual design layout, or resist image, or aerial image, or a combination thereof. $f_p(z_1, z_2, \ldots, z_N)$ can also be a function of one or more stochastic effects such as the LWR, which are functions of the design variables $(z_1, z_2, \ldots, z_N)$. The cost function may represent any suitable characteristics of the lithographic projection apparatus or the substrate, for instance, failure rate of a feature, focus, CD, image shift, image distortion, image rotation, stochastic effects, throughput, CDU, or a combination thereof. CDU is local CD variation (e.g., three times of the standard deviation of the local CD distribution). CDU may be interchangeably referred to as LCDU. In one embodiment, the cost function represents (i.e., is a function of) CDU, throughput, and the stochastic effects. In one embodiment, the cost function represents (i.e., is a function of) EPE, throughput, and the stochastic effects. In one embodiment, the design variables $(z_1, z_2, \ldots, z_N)$ comprise dose, global bias of the patterning device, shape of illumination from the source, or a combination thereof. Since it is the resist image that often dictates the circuit pattern on a substrate, the cost function often includes functions that represent some characteristics of the resist image. For example, $f_p(z_1, z_2, \ldots, z_N)$ of such an evaluation point can be simply a distance between a point in the resist image to an intended position of that point (i.e., edge placement error $EPE_p(z_1, z_2, \ldots, z_N)$). The design variables can be any adjustable parameters such as adjustable parameters of the source, the patterning device, the projection optics, dose, focus, etc. The projection optics may include components collectively called as "wavefront manipulator" that can be used to adjust shapes of a wavefront and intensity distribution and/or phase shift of the irradiation beam. The projection optics preferably can adjust a wavefront and intensity distribution at any location along an optical path of the lithographic projection apparatus, such as before the patterning device, near a pupil plane, near an image plane, near a focal plane. The projection optics can be used to correct or compensate for certain distortions of the wavefront and intensity distribution caused by, for example, the source, the patterning device, temperature variation in the lithographic projection apparatus, thermal expansion of components of the lithographic projection apparatus. Adjusting the wavefront and intensity distribution can change values of the evaluation points and the cost function. Such changes can be simulated from a model or actually measured. Of course, $CF(z_1, z_2, \ldots, z_N)$ is not limited the form in Eq. 1. $CF(z_1, z_2, \ldots, z_N)$ can be in any other suitable form.

It should be noted that the normal weighted root mean square (RMS) of $f_p(z_1, z_2, \ldots, z_N)$ is defined as $$\sqrt{\frac{1}{P}\sum_{p=1}^{P} w_p f_p^2(z_1, z_2, \ldots, z_N)},$$

therefore, minimizing the weighted RMS of $f_p(z_1, z_2, \ldots, z_N)$ is equivalent to minimizing the cost function $$CF(z_1, z_2, \ldots, z_N) = \sum_{p=1}^{P} w_p f_p^2(z_1, z_2, \ldots, z_N),$$

defined in Eq. 1. Thus, the weighted RMS of $f_p(z_1, z_2, \ldots, z_N)$ and Eq. 1 may be utilized interchangeably for notational simplicity herein.

Further, if considering maximizing the PW (Process Window), one can consider the same physical location from different PW conditions as different evaluation points in the cost function in (Eq. 1). For example, if considering N PW conditions, then one can categorize the evaluation points according to their PW conditions and write the cost functions as:

$$CF(z_1, z_2, \ldots, z_N) = \sum_{p=1}^{P} w_p f_p^2(z_1, z_2, \ldots, z_N) = \sum_{u=1}^{U}\sum_{p_u=1}^{P_u} w_{p_u} f_{p_u}^2(z_1, z_2, \ldots, z) \quad \text{(Eq. 1')}$$

Where $f_p(z_1, z_2, \ldots, z_N)$ is the value of $f_p(z_1, z_2, \ldots, z_N)$ under the u-th PW condition u=1, ..., U. When $f_p(z_1, z_2, \ldots, z_N)$ is the EPE, then minimizing the above cost function is equivalent to minimizing the edge shift under various PW conditions, thus this leads to maximizing the PW. In particular, if the PW also consists of different mask bias, then minimizing the above cost function also includes the minimization of MEEF (Mask Error Enhancement Factor), which is defined as the ratio between the substrate EPE and the induced mask edge bias.

The design variables may have constraints, which can be expressed as $(z_1, z_2, \ldots, z_N) \in Z$, where Z is a set of possible values of the design variables. One possible constraint on the design variables may be imposed by a desired throughput of the lithographic projection apparatus. The desired throughput may limit the dose and thus has implications for the stochastic effects (e.g., imposing a lower bound on the stochastic effects). Higher throughput generally leads to lower dose, shorter longer exposure time and greater stochastic effects. Consideration of substrate throughput and minimization of the stochastic effects may constrain the possible values of the design variables because the stochastic effects are function of the design variables. Without such a constraint imposed by the desired throughput, the optimization may yield a set of values of the design variables that are unrealistic. For example, if the dose is among the design variables, without such a constraint, the optimization may yield a dose value that makes the throughput economically impossible. However, the usefulness of constraints should not be interpreted as a necessity. The throughput may be affected by the failure rate based adjustment to parameters of the patterning process. It is desirable to have lower failure rate of the feature while maintaining a high throughput. Throughput may also be affected by the resist chemistry. Slower resist (e.g., a resist that requires higher amount of light to be properly exposed) leads to lower throughput. Thus, based on the optimization process involving failure rate of a feature due to resist chemistry or fluctuations, and dose requirements for higher throughput, appropriate parameters of the patterning process may be determined.

The optimization process therefore is to find a set of values of the design variables, under the constraints $(z_1, z_2, \ldots, z_N) \in Z$, that minimize the cost function, i.e., to find $$(\tilde{z}_1, \tilde{z}_2, \ldots \tilde{z}_N) = \underset{(z_1, z_2, \ldots, z_N) \in Z}{\operatorname{argmin}} CF(z_1, z_2, \ldots, z_N) = \underset{(z_1, z_2, \ldots, z_N) \in Z}{\operatorname{argmin}} \sum_{p=1}^{P} w_p f_p^2(z_1, z_2, \ldots, z_N)$$

(Eq. 2)

Figure 10:
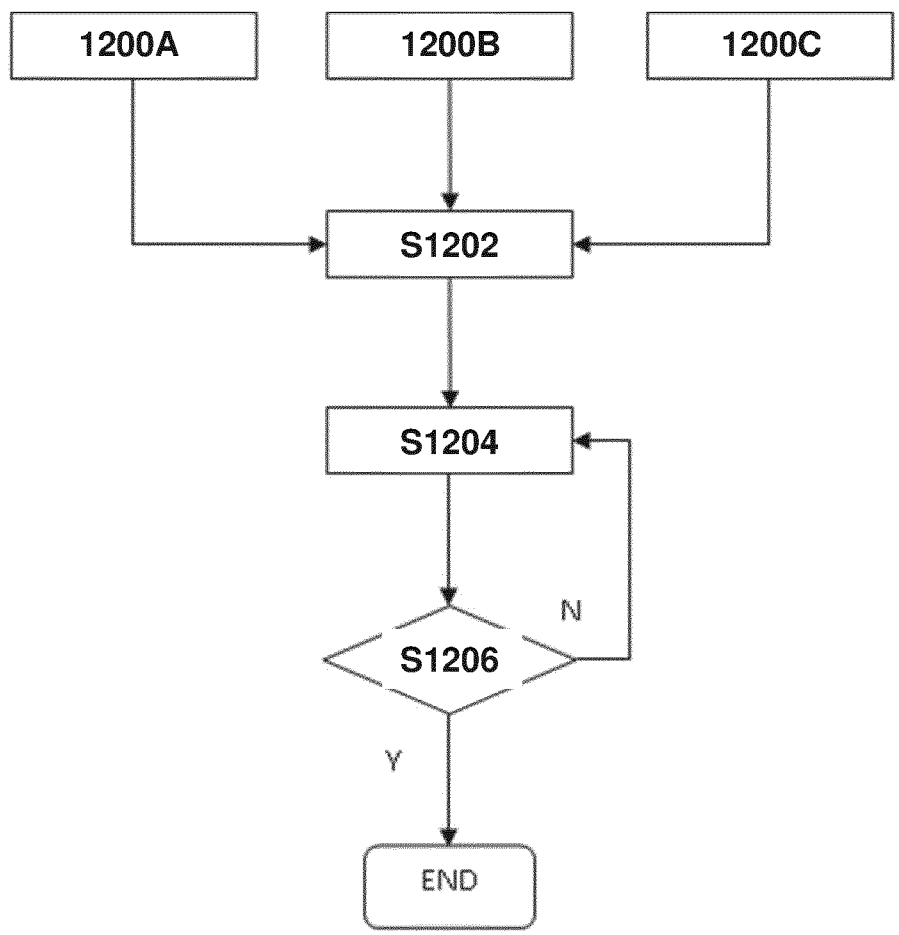
FIG. 10 is a flow diagram illustrating aspects of an example methodology of joint optimization, according to an embodiment.

A general method of optimizing the lithography projection apparatus, according to an embodiment, is illustrated in FIG. 10. This method comprises a step S1202 of defining a multi-variable cost function of a plurality of design variables. The design variables may comprise any suitable combination selected from characteristics of the illumination source (1200A) (e.g., pupil fill ratio, namely percentage of radiation of the source that passes through a pupil or aperture), characteristics of the projection optics (1200B) and characteristics of the design layout (1200C). For example, the design variables may include characteristics of the illumination source (1200A) and characteristics of the design layout (1200C) (e.g., global bias) but not characteristics of the projection optics (1200B), which leads to an SMO. Alternatively, the design variables may include characteristics of the illumination source (1200A), characteristics of the projection optics (1200B) and characteristics of the design layout (1200C), which leads to a source-mask-lens optimization (SMLO). In step S1204, the design variables are simultaneously adjusted so that the cost function is moved towards convergence. In step S1206, it is determined whether a predefined termination condition is satisfied. The predetermined termination condition may include various possibilities, i.e. the cost function may be minimized or maximized, as required by the numerical technique used, the value of the cost function has been equal to a threshold value or has crossed the threshold value, the value of the cost function has reached within a preset error limit, or a preset number of iteration is reached. If either of the conditions in step S1206 is satisfied, the method ends. If none of the conditions in step S1206 is satisfied, the step S1204 and S1206 are iteratively repeated until a desired result is obtained. The optimization does not necessarily lead to a single set of values for the design variables because there may be physical restraints caused by factors such as the failure rates, the pupil fill factor, the resist chemistry, the throughput, etc. The optimization may provide multiple sets of values for the design variables and associated performance characteristics (e.g., the throughput) and allows a user of the lithographic apparatus to pick one or more sets.

In a lithographic projection apparatus, the source, patterning device and projection optics can be optimized alternatively (referred to as Alternative Optimization) or optimized simultaneously (referred to as Simultaneous Optimization). The terms "simultaneous", "simultaneously", "joint" and "jointly" as used herein mean that the design variables of the characteristics of the source, patterning device, projection optics and/or any other design variables, are allowed to change at the same time. The term "alternative" and "alternatively" as used herein mean that not all of the design variables are allowed to change at the same time.

Figure 11:
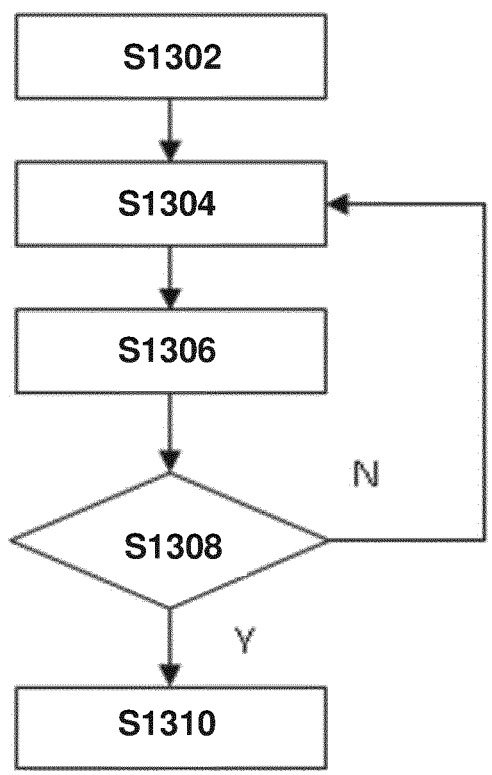
FIG. 11 shows an embodiment of another optimization method, according to an embodiment.

In FIG. 11, the optimization of all the design variables is executed simultaneously. Such flow may be called the simultaneous flow or co-optimization flow. Alternatively, the optimization of all the design variables is executed alternatively, as illustrated in FIG. 11. In this flow, in each step, some design variables are fixed while the other design variables are optimized to minimize the cost function; then in the next step, a different set of variables are fixed while the others are optimized to minimize the cost function. These steps are executed alternatively until convergence or certain terminating conditions are met.

As shown in the non-limiting example flowchart of FIG. 11, first, a design layout (step S1302) is obtained, then a step of source optimization is executed in step S1304, where all the design variables of the illumination source are optimized (SO) to minimize the cost function while all the other design variables are fixed. Then in the next step S1306, a mask optimization (MO) is performed, where all the design variables of the patterning device are optimized to minimize the cost function while all the other design variables are fixed. These two steps are executed alternatively, until certain terminating conditions are met in step S1308. Various termination conditions can be used, such as, the value of the cost function becomes equal to a threshold value, the value of the cost function crosses the threshold value, the value of the cost function reaches within a preset error limit, or a preset number of iteration is reached, etc. Note that SO-MO-Alternative-Optimization is used as an example for the alternative flow. The alternative flow can take many different forms, such as SO-LO-MO-Alternative-Optimization, where SO, LO (Lens Optimization) is executed, and MO alternatively and iteratively; or first SMO can be executed once, then execute LO and MO alternatively and iteratively; and so on. Finally the output of the optimization result is obtained in step S1310, and the process stops.

The pattern selection algorithm, as discussed before, may be integrated with the simultaneous or alternative optimization. For example, when an alternative optimization is adopted, first a full-chip SO can be performed, the 'hot spots' and/or 'warm spots' are identified, then an MO is performed. In view of the present disclosure numerous permutations and combinations of sub-optimizations are possible in order to achieve the desired optimization results.

Figure 12A:
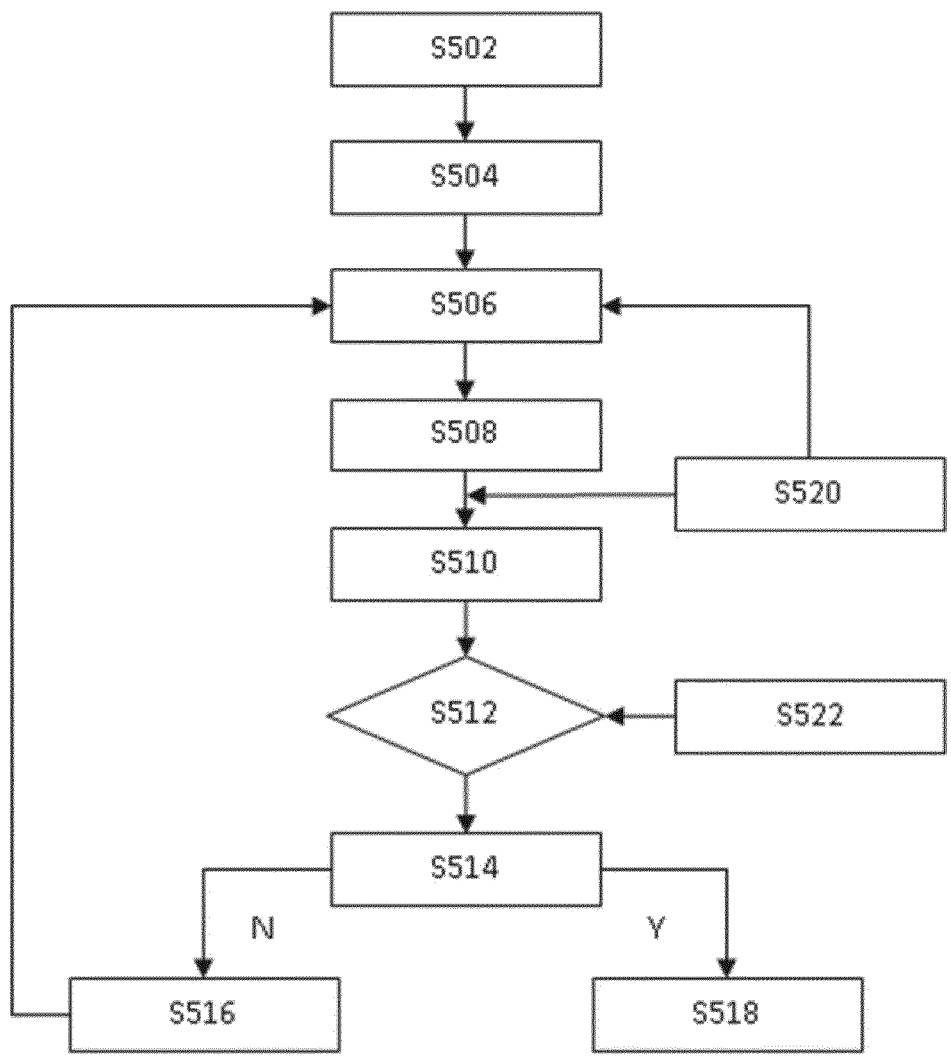
FIGS. 12A, 12B and 13 show example flowcharts of various optimization processes, according to an embodiment.

FIG. 12A shows one exemplary method of optimization, where a cost function is minimized. In step S502, initial values of design variables are obtained, including their tuning ranges, if any. In step S504, the multi-variable cost function is set up. In step S506, the cost function is expanded within a small enough neighborhood around the starting point value of the design variables for the first iterative step (i=0). In step S508, standard multi-variable optimization techniques are applied to minimize the cost function. Note that the optimization problem can apply constraints, such as tuning ranges, during the optimization process in S508 or at a later stage in the optimization process. Step S520 indicates that each iteration is done for the given test patterns (also known as "gauges") for the identified evaluation points that have been selected to optimize the lithographic process. In step S510, a lithographic response is predicted. In step S512, the result of step S510 is compared with a desired or ideal lithographic response value obtained in step S522. If the termination condition is satisfied in step S514, i.e. the optimization generates a lithographic response value sufficiently close to the desired value, and then the final value of the design variables is outputted in step S518. The output step may also include outputting other functions using the final values of the design variables, such as outputting a wavefront aberration-adjusted map at the pupil plane (or other planes), an optimized source map, and optimized design layout etc. If the termination condition is not satisfied, then in step S516, the values of the design variables is updated with the result of the i-th iteration, and the process goes back to step S506. The process of FIG. 12A is elaborated in details below.

In an exemplary optimization process, no relationship between the design variables $(z_1, z_2, \ldots, z_N)$ and $f_p(z_1, z_2, \ldots, z_N)$ is assumed or approximated, except that $f_p(z_1, z_2, \ldots, z_N)$ is sufficiently smooth (e.g. first order derivatives $$\frac{\partial f_p(z_1, z_2, \ldots, z_N)}{\partial z_n},$$

(n=1, 2, . . . N) exist), which is generally valid in a lithographic projection apparatus. An algorithm, such as the Gauss-Newton algorithm, the Levenberg-Marquardt algorithm, the gradient descent algorithm, simulated annealing, the genetic algorithm, can be applied to find $(\tilde{z}_1, \tilde{z}_2, \ldots, \tilde{z}_N)$.

Here, the Gauss-Newton algorithm is used as an example. The Gauss-Newton algorithm is an iterative method applicable to a general non-linear multi-variable optimization problem. In the i-th iteration wherein the design variables $(z_1, z_2, \ldots, z_N)$ take values of $(z_{1i}, z_{2i}, \ldots, z_{Ni})$ the Gauss-Newton algorithm linearizes $f_p(z_1, z_2, \ldots, z_N)$ in the vicinity of $(z_{1i}, z_{2i}, \ldots, z_{Ni})$, and then calculates values $(z_{1(i+1)}, z_{2(i+1)}, \ldots, z_{N(i+1)})$ in the vicinity of $(z_{1i}, z_{2i}, \ldots, z_{Ni})$ that give a minimum of $CF(z_1, z_2, \ldots, z_N)$. The design variables $(z_1, z_2, \ldots, z_N)$ take the values of $(z_{1(i+1)}, z_{2(I+1)}, \ldots, z_{N(i+1)})$ in the (i+1)-th iteration. This iteration continues until convergence (i.e. $CF(z_1, z_2, \ldots, z_N)$ does not reduce any further) or a preset number of iterations is reached.

Specifically, in the i-th iteration, in the vicinity of $(z_1, z_2, \ldots, z_N)$, $$f_p(z_1, z_2, \ldots, z_N) \approx f_p(z_{1i}, z_{2i}, \ldots, z_{Ni}) + \sum_{n=1}^{N} \frac{\partial f_p(z_1, z_2, \ldots, z_N)}{\partial z_n}\bigg|_{z_1=z_{1i}, z_2=z_{2i}, \ldots, z_N=z_{Ni}} (z_n - z_{ni}) \quad \text{(Eq. 3)}$$

Under the approximation of Eq. 3, the cost function becomes:

$$CF(z_1, z_2, \ldots, z_N) = \sum_{p=1}^{P} w_p f_p^2(z_1, z_2, \ldots, z_N) = \sum_{p=1}^{P} w_p \left( f_p(z_{1i}, z_{2i}, \ldots, z_{Ni}) + \sum_{n=1}^{N} \frac{\partial f_p(z_1, z_2, \ldots, z_N)}{\partial z_n}\bigg|_{z_1=z_{1i}, z_2=z_{2i}, \ldots, z_N=z_{Ni}} (z_n - z_{ni}) \right)^2 \quad \text{(Eq. 4)}$$

which is a quadratic function of the design variables $(z_1, z_2, \ldots, z_N)$. Every term is constant except the design variables $(z_1, z_2, \ldots, z_N)$.

If the design variables $(z_1, z_2, \ldots, z_N)$ are not under any constraints, $(z_{1(i+1)}, z_{2(i+1)}, \ldots, z_{N(i+1)})$ can be derived by solving by N linear equations:

$$\frac{\partial CF(z_1, z_2, \ldots, z_N)}{\partial z_n} = 0, \text{ wherein } n = 1, 2, \ldots N.$$

If the design variables $(z_1, z_2, \ldots, z_N)$ are under the constraints in the form of J inequalities (e.g. tuning ranges of $(z_1, z_2, \ldots, z_N)$)

$$\sum_{n=1}^{N} A_{nj} z_n \leq B_j,$$

for j=1, 2, . . . J; and K equalities (e.g. interdependence between the design variables)

$$\sum_{n=1}^{N} C_{nk} z_n = D_k,$$

for k=1, 2, . . . K; the optimization process becomes a classic quadratic programming problem, wherein $A_{nj}$, $B_j$, $C_{nk}$, $D_k$ are constants. Additional constraints can be imposed for each iteration. For example, a "damping factor" $\Delta_D$ can be introduced to limit the difference between $(z_{1(i+1)}, z_{2(i+1)}, \ldots, z_{N(i+1)})$ and $(z_1, z_2, \ldots, z_N)$, so that the approximation of Eq. 3 holds. Such constraints can be expressed as $z_{ni}-\Delta_D \leq z_n \leq z_{ni}+\Delta_D$. $(z_{1(i+1)}, z_{2(i+1)}, \ldots, z_{N(i+1)})$ can be derived using, for example, methods described in Numerical Optimization ($2^{nd}$ ed.) by Jorge Nocedal and Stephen J. Wright (Berlin New York: Vandenberghe. Cambridge University Press).

Instead of minimizing the RMS of $f_p(z_1, z_2, \ldots, z_N)$, the optimization process can minimize magnitude of the largest deviation (the worst defect) among the evaluation points to their intended values. In this approach, the cost function can alternatively be expressed as $$CF(z_1, z_2, \ldots, z_N) = \max_{1 \leq p \leq P} \frac{f_p(z_1, z_2, \ldots, z_N)}{CL_p}, \quad (\text{Eq. 5})$$

wherein $CL_p$ is the maximum allowed value for $f_p(z_1, z_2, \ldots, z_N)$. This cost function represents the worst defect among the evaluation points. Optimization using this cost function minimizes magnitude of the worst defect. An iterative greedy algorithm can be used for this optimization.

The cost function of Eq. 5 can be approximated as:

$$CF(z_1, z_2, \ldots, z_N) = \sum_{p=1}^{P} \left( \frac{f_p(z_1, z_2, \ldots, z_N)}{CL_p} \right)^q, \quad (\text{Eq. 6})$$

wherein q is an even positive integer such as at least 4, preferably at least 10. Eq. 6 mimics the behavior of Eq. 5, while allowing the optimization to be executed analytically and accelerated by using methods such as the deepest descent method, the conjugate gradient method, etc.

Minimizing the worst defect size can also be combined with linearizing of $f_p(z_1, z_2, \ldots, z_N)$. Specifically, $f_p(z_1, z_2, \ldots, z_N)$ is approximated as in Eq. 3. Then the constraints on worst defect size are written as inequalities $E_{Lp} \leq f_p(z_1, z_2, \ldots, z_N) \leq E_{Up}$, wherein $E_{Lp}$ and $E_{Up}$ are two constants specifying the minimum and maximum allowed deviation for the $f_p(z_1, z_2, \ldots, z_N)$. Plugging Eq. 3 in, these constraints are transformed to, for $p=1, \ldots P$, $$\sum_{n=1}^{N} \frac{\partial f_p(z_1, z_2, \ldots, z_N)}{\partial z_N} \bigg|_{z_1=z_{1i}=z_{2i}, \ldots, z_N=z_{Ni}, z_n} \leq E_{Up} + \sum_{n=1}^{N} \frac{\partial f_p(z_1, z_2, \ldots, z_N)}{\partial z_N} \bigg|_{z_1=z_{1i}=z_{2i}, \ldots, z_N=z_{Ni}},$$

$$z_{ni} - f_p(z_{1i}, z_{2i}, \ldots, z_{Ni}) \text{ and} \quad (\text{Eq. 6'})$$

$$-\sum_{n=1}^{N} \frac{\partial f_p(z_1, z_2, \ldots, z_N)}{\partial z_N} \bigg|_{z_1=z_{1i}=z_{2i}, \ldots, z_N=z_{Ni}, z_n} \leq -E_{Lp} - \sum_{n=1}^{N} \frac{\partial f_p(z_1, z_2, \ldots, z_N)}{\partial z_n} \bigg|_{z_1=z_{1i}=z_{2i}, \ldots, z_N=z_{Ni}},$$

$$z_{ni} + f_p(z_{1i}, z_{2i}, \ldots, z_{Ni}) \quad (\text{Eq. 6''})$$

Since Eq. 3 is generally valid only in the vicinity of $(z_{1i}, z_{2i}, \ldots, z_{Ni})$, in case the desired constraints $E_{Lp} \leq f_p(z_1, z_2, \ldots, z_N) \leq E_{Up}$ cannot be achieved in such vicinity, which can be determined by any conflict among the inequalities, the constants $E_{Lp}$ and $E_{Up}$ can be relaxed until the constraints are achievable. This optimization process minimizes the worst defect size in the vicinity of $(z_{1i}, z_{2i}, \ldots, z_{Ni})$. Then each step reduces the worst defect size gradually, and each step is executed iteratively until certain terminating conditions are met. This will lead to optimal reduction of the worst defect size.

Another way to minimize the worst defect is to adjust the weight $w_p$ in each iteration. For example, after the i-th iteration, if the r-th evaluation point is the worst defect, $w_r$ can be increased in the (i+1)-th iteration so that the reduction of that evaluation point's defect size is given higher priority.

In addition, the cost functions in Eq.4 and Eq.5 can be modified by introducing a Lagrange multiplier to achieve compromise between the optimization on RMS of the defect size and the optimization on the worst defect size, i.e., $$CF(z_1, z_2, \ldots, z_N) = \quad (\text{Eq. 6'''})$$
$$(1-\lambda)\sum_{p=1}^{P} w_p f_p^2(z_1, z_2, \ldots, z_N) + \lambda \max_{1 \leq p \leq P} \frac{f_p(z_1, z_2, \ldots, z_N)}{CL_p}$$

where $\lambda$ is a preset constant that specifies the trade-off between the optimization on RMS of the defect size and the optimization on the worst defect size. In particular, if $\lambda=0$, then this becomes Eq.4 and the RMS of the defect size is only minimized; while if $\lambda=1$, then this becomes Eq.5 and the worst defect size is only minimized; if $0<\lambda<1$, then both are taken into consideration in the optimization. Such optimization can be solved using multiple methods. For example, the weighting in each iteration may be adjusted, similar to the one described previously. Alternatively, similar to minimizing the worst defect size from inequalities, the inequalities of Eq. 6' and 6" can be viewed as constraints of the design variables during solution of the quadratic programming problem. Then, the bounds on the worst defect size can be relaxed incrementally or increase the weight for the worst defect size incrementally, compute the cost function value for every achievable worst defect size, and choose the design variable values that minimize the total cost function as the initial point for the next step. By doing this iteratively, the minimization of this new cost function can be achieved.

Optimizing a lithographic projection apparatus can expand the process window. A larger process window provides more flexibility in process design and chip design. The process window can be defined as a set of focus and dose values for which the resist image are within a certain limit of the design target of the resist image. Note that all the methods discussed here may also be extended to a generalized process window definition that can be established by different or additional base parameters in addition to exposure dose and defocus. These may include, but are not limited to, optical settings such as NA, sigma, aberrations, polarization, or optical constants of the resist layer. For example, as described earlier, if the PW also consists of different mask bias, then the optimization includes the minimization of MEEF (Mask Error Enhancement Factor), which is defined as the ratio between the substrate EPE and the induced mask edge bias. The process window defined on focus and dose values only serve as an example in this disclosure. A method of maximizing the process window, according to an embodiment, is described below.

In a first step, starting from a known condition ($f_0$, $\varepsilon_0$) in the process window, wherein $f_0$ is a nominal focus and $\varepsilon_0$ is a nominal dose, minimizing one of the cost functions below in the vicinity ($f_0 \pm \Delta f$, $\varepsilon_0 \pm \Delta \varepsilon$):

$$CF(z_1, z_2, \ldots, z_N, f_0, \varepsilon_0) = \max_{(f,\varepsilon)=(f_0 \pm \Delta f, \varepsilon_0 \pm \varepsilon)} \max_p |f_p(z_1, z_2, \ldots, z_N, f, \varepsilon)|. \quad \text{(Eq. 7)}$$

or $$CF(z_1, z_2, \ldots, z_N, f_0, \varepsilon_0) = \sum_{(f,\varepsilon)=(f_0 \pm \Delta f, \varepsilon_0 \pm \Delta \varepsilon)} \sum_p w_p f_p^2(z_1, z_2, \ldots, z_N, f, \varepsilon) \quad \text{(Eq. 7')}$$

or $$CF(z_1, z_2, \ldots, z_N, f_0, \varepsilon_0) = (1 - \lambda) \sum_{(f,\varepsilon)=(f_0 \pm \Delta f, \varepsilon_0 \pm \Delta \varepsilon)} \sum_p w_p f_p^2(z_1, z_2, \ldots, z_N, f, \varepsilon) + \lambda \max_{(f,\varepsilon)=(f_0 \pm \Delta f, \varepsilon_0 \pm \varepsilon)} \max_p |f_p(z_1, z_2, \ldots, z_N, f, \varepsilon)| \quad \text{(Eq. 7'')}$$

If the nominal focus $f_0$ and nominal dose $\varepsilon_0$ are allowed to shift, they can be optimized jointly with the design variables ($z_1, z_2, \ldots, z_N$). In the next step, ($f_0 \pm \Delta f$, $\varepsilon_0 \pm \Delta \varepsilon$) is accepted as part of the process window, if a set of values of ($z_1, z_2, \ldots, z_N, f, \varepsilon$) can be found such that the cost function is within a preset limit.

Alternatively, if the focus and dose are not allowed to shift, the design variables ($z_1, z_2, \ldots, z_N$) are optimized with the focus and dose fixed at the nominal focus $f_0$ and nominal dose $\varepsilon_0$. In an alternative embodiment, ($f_0 \pm \Delta f$, $\varepsilon_0 \pm \Delta \varepsilon$) is accepted as part of the process window, if a set of values of ($z_1, z_2, \ldots, z_N$) can be found such that the cost function is within a preset limit.

The methods described earlier in this disclosure can be used to minimize the respective cost functions of Eqs. 7, 7', or 7''. If the design variables are characteristics of the projection optics, such as the Zernike coefficients, then minimizing the cost functions of Eqs. 7, 7', or 7'' leads to process window maximization based on projection optics optimization, i.e., LO. If the design variables are characteristics of the source and patterning device in addition to those of the projection optics, then minimizing the cost function of Eqs. 7, 7', or 7'' leads to process window maximizing based on SMLO, as illustrated in FIG. 11. If the design variables are characteristics of the source and patterning device and, then minimizing the cost functions of Eqs. 7, 7', or 7'' leads to process window maximization based on SMO. The cost functions of Eqs. 7, 7', or 7'' can also include at least one $f_p(z_1, z_2, \ldots, z_N)$ such as that in Eq. 7 or Eq. 8, that is a function of one or more stochastic effects such as the LWR or local CD variation of 2D features, and throughput.

Figure 13:
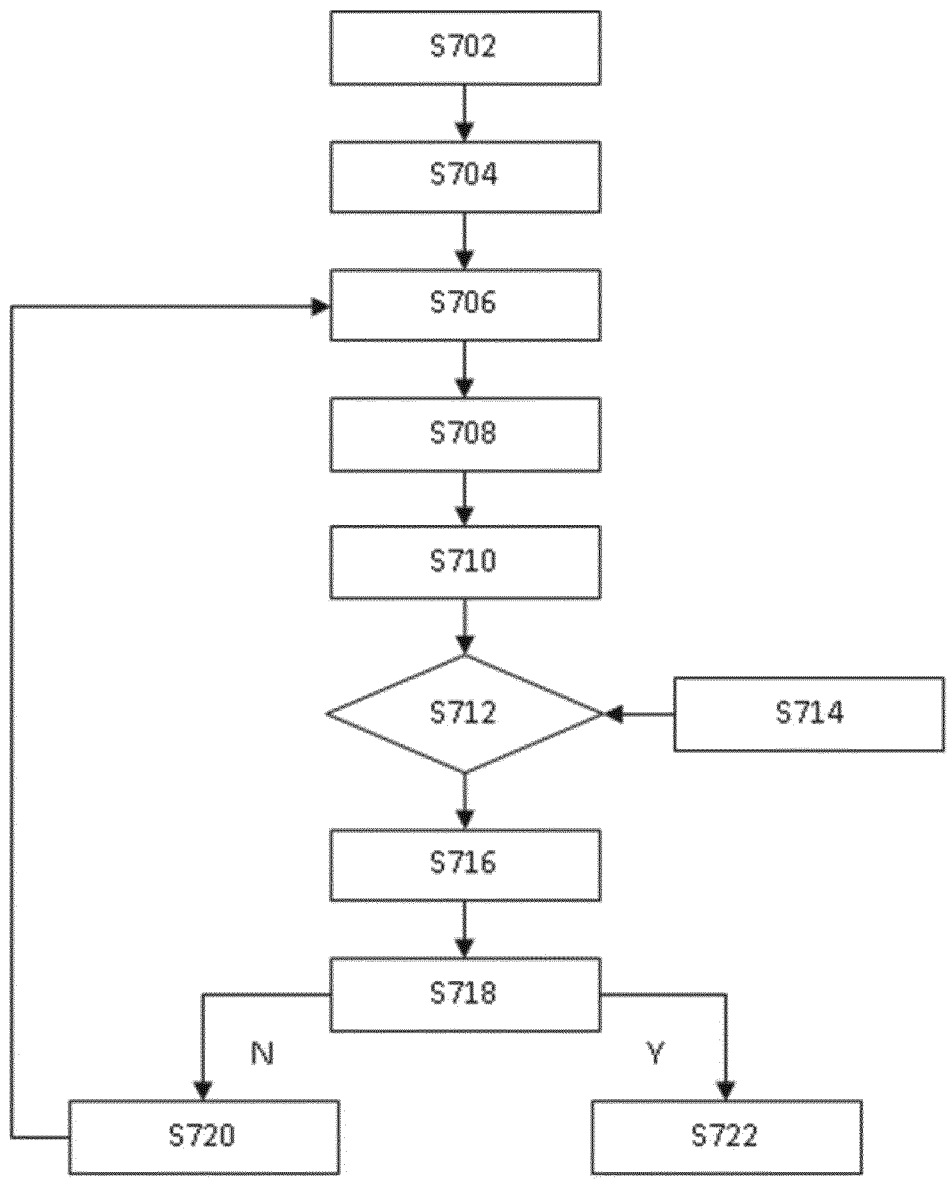

FIG. 13 shows one specific example of how a simultaneous SMLO process can use a Gauss Newton Algorithm for optimization. In step S702, starting values of design variables are identified. Tuning ranges for each variable may also be identified. In step S704, the cost function is defined using the design variables. In step S706 cost function is expanded around the starting values for all evaluation points in the design layout. In optional step S710, a full-chip simulation is executed to cover all critical patterns in a full-chip design layout. Desired lithographic response metric (such as CD or EPE) is obtained in step S714, and compared with predicted values of those quantities in step S712. In step S716, a process window is determined. Steps S718, S720, and S722 are similar to corresponding steps S514, S516 and S518, as described with respect to FIG. 12A. As mentioned before, the final output may be a wavefront aberration map in the pupil plane, optimized to produce the desired imaging performance. The final output may also be an optimized source map and/or an optimized design layout.

Figure 12B:
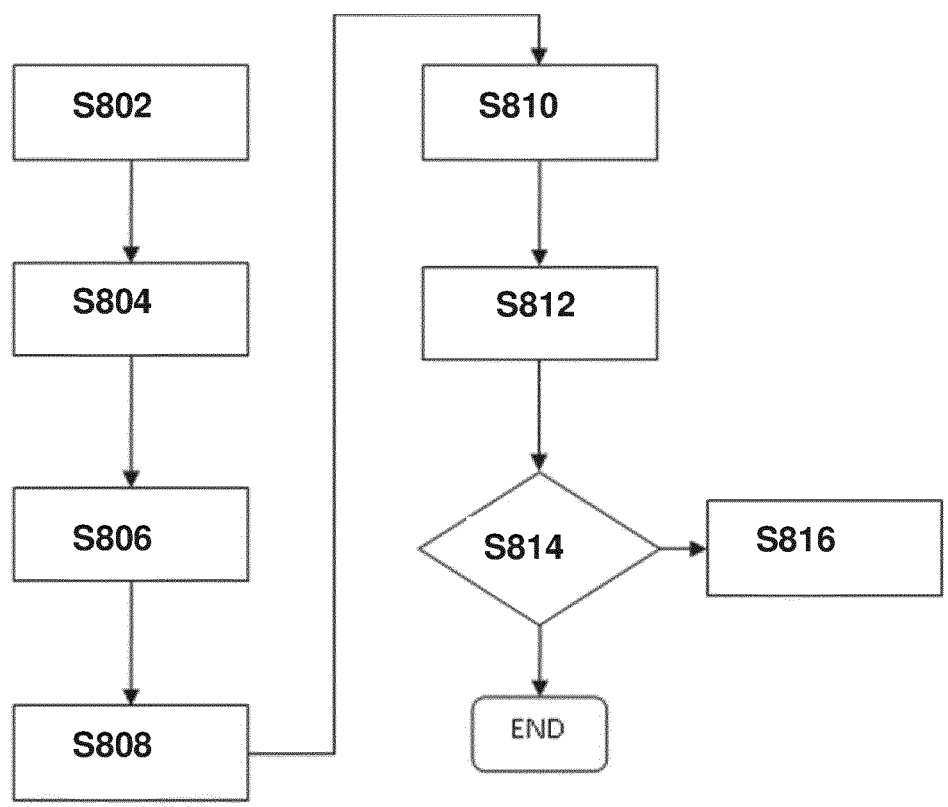

FIG. 12B shows an exemplary method to optimize the cost function where the design variables ($z_1, z_2, \ldots, z_N$) include design variables that may only assume discrete values.

The method starts by defining the pixel groups of the illumination source and the patterning device tiles of the patterning device (step S802). Generally, a pixel group or a patterning device tile may also be referred to as a division of a lithographic process component. In one exemplary approach, the illumination source is divided into 117 pixel groups, and 94 patterning device tiles are defined for the patterning device, substantially as described above, resulting in a total of 211 divisions.

In step S804, a lithographic model is selected as the basis for photolithographic simulation. Photolithographic simulations produce results that are used in calculations of photolithographic metrics, or responses. A particular photolithographic metric is defined to be the performance metric that is to be optimized (step S806). In step S808, the initial (pre-optimization) conditions for the illumination source and the patterning device are set up.

Initial conditions include initial states for the pixel groups of the illumination source and the patterning device tiles of the patterning device such that references may be made to an initial illumination shape and an initial patterning device pattern. Initial conditions may also include mask bias, NA, and focus ramp range. Although steps S802, S804, S806, and S808 are depicted as sequential steps, it will be appreciated that in other embodiments of the invention, these steps may be performed in other sequences.

In step S810, the pixel groups and patterning device tiles are ranked. Pixel groups and patterning device tiles may be interleaved in the ranking. Various ways of ranking may be employed, including: sequentially (e.g., from pixel group 1 to pixel group 117 and from patterning device tile 1 to patterning device tile 94), randomly, according to the physical locations of the pixel groups and patterning device tiles (e.g., ranking pixel groups closer to the center of the illumination source higher), and according to how an alteration of the pixel group or patterning device tile affects the performance metric.

Once the pixel groups and patterning device tiles are ranked, the illumination source and patterning device are adjusted to improve the performance metric (step S812). In step S812, each of the pixel groups and patterning device tiles are analyzed, in order of ranking, to determine whether an alteration of the pixel group or patterning device tile will result in an improved performance metric. If it is determined that the performance metric will be improved, then the pixel group or patterning device tile is accordingly altered, and the resulting improved performance metric and modified illumination shape or modified patterning device pattern form the baseline for comparison for subsequent analyses of lower-ranked pixel groups and patterning device tiles. In other words, alterations that improve the performance metric are retained. As alterations to the states of pixel groups and patterning device tiles are made and retained, the initial illumination shape and initial patterning device pattern changes accordingly, so that a modified illumination shape and a modified patterning device pattern result from the optimization process in step S812.

In other approaches, patterning device polygon shape adjustments and pairwise polling of pixel groups and/or patterning device tiles are also performed within the optimization process of S812.

In an alternative embodiment the interleaved simultaneous optimization procedure may include to alter a pixel group of the illumination source and if an improvement of the performance metric is found, the dose is stepped up and down to look for further improvement. In a further alternative embodiment the stepping up and down of the dose or intensity may be replaced by a bias change of the patterning device pattern to look for further improvement in the simultaneous optimization procedure.

In step S814, a determination is made as to whether the performance metric has converged. The performance metric may be considered to have converged, for example, if little or no improvement to the performance metric has been witnessed in the last several iterations of steps S810 and S812. If the performance metric has not converged, then the steps of S810 and S812 are repeated in the next iteration, where the modified illumination shape and modified patterning device from the current iteration are used as the initial illumination shape and initial patterning device for the next iteration (step S816).

The optimization methods described above may be used to increase the throughput of the lithographic projection apparatus. For example, the cost function may include an $f_p(z_1, z_2, \ldots, z_N)$ that is a function of the exposure time. Optimization of such a cost function is preferably constrained or influenced by a measure of the stochastic effects or other metrics. Specifically, a computer-implemented method for increasing a throughput of a lithographic process may include optimizing a cost function that is a function of one or more stochastic effects of the lithographic process and a function of an exposure time of the substrate, in order to minimize the exposure time.

In one embodiment, the cost function includes at least one $f_p(z_1, z_2, \ldots, z_N)$ that is a function of one or more stochastic effects. The stochastic effects may include the failure of a feature, measurement data (e.g., SEPE) determined as in method of FIG. 3, LWR or local CD variation of 2D features. In one embodiment, the stochastic effects include stochastic variations of characteristics of a resist image. For example, such stochastic variations may include failure rate of a feature, line edge roughness (LER), line width roughness (LWR) and critical dimension uniformity (CDU). Including stochastic variations in the cost function allows finding values of design variables that minimize the stochastic variations, thereby reducing risk of defects due to stochastic effects.

Figure 14:
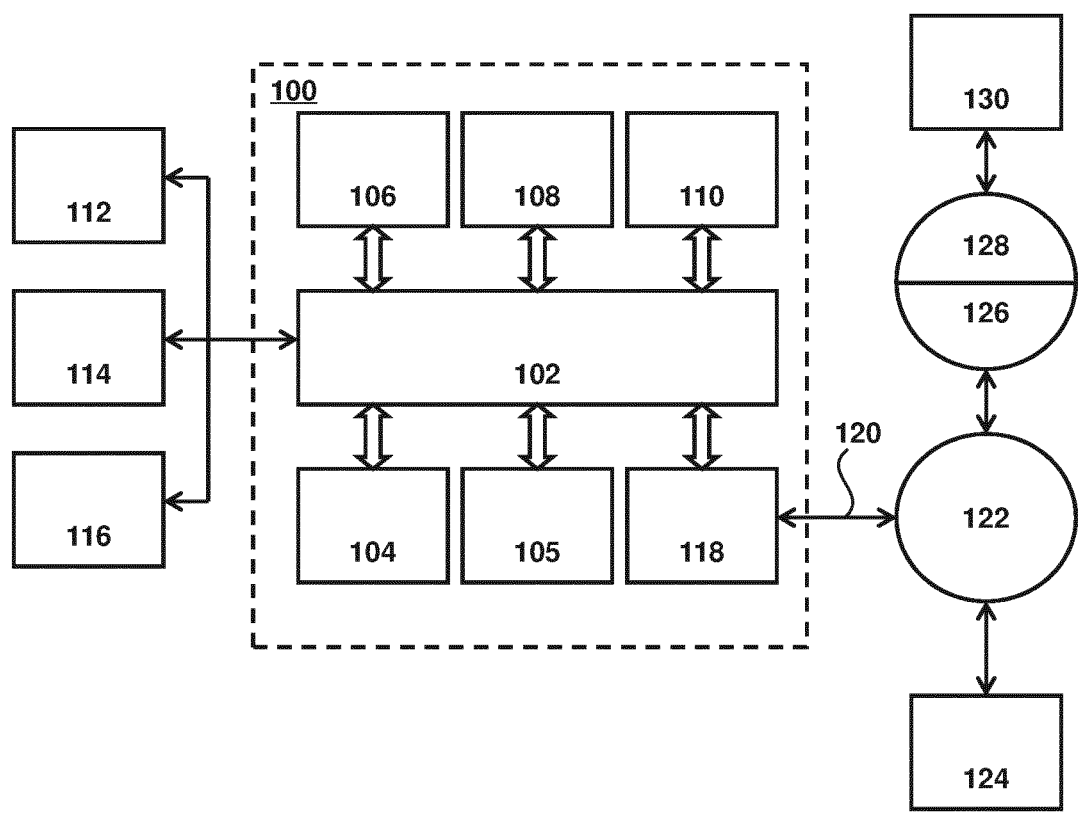
FIG. 14 is a block diagram of an example computer system, according to an embodiment.

FIG. 14 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 15:
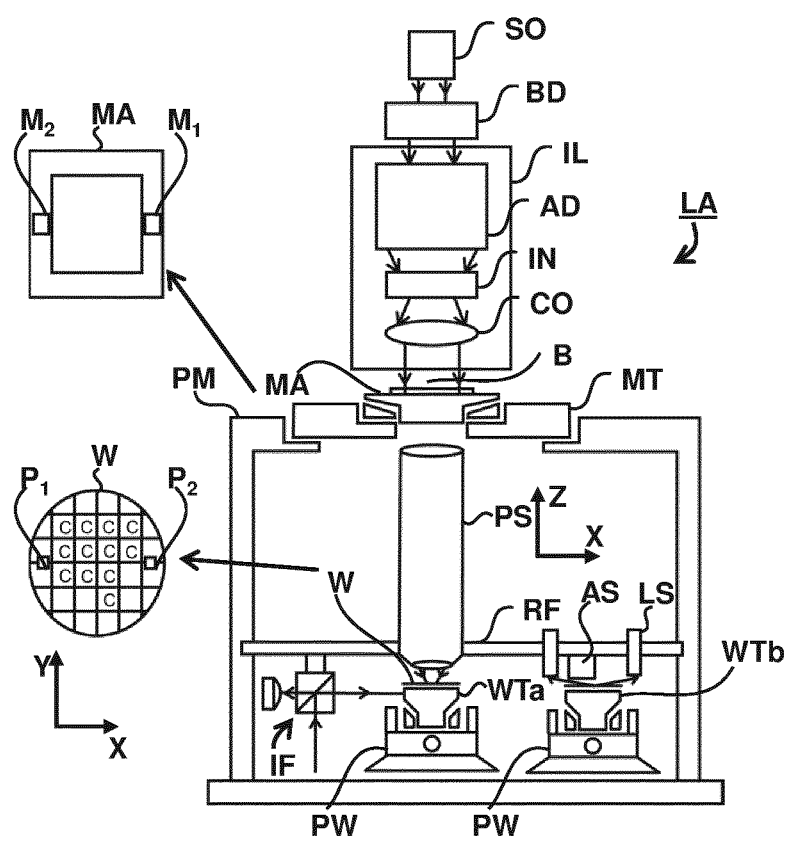
FIG. 15 is a schematic diagram of a lithographic projection apparatus, according to an embodiment.

FIG. 15 schematically depicts an exemplary lithographic projection apparatus whose illumination source could be optimized utilizing the methods described herein. The apparatus comprises:

an illumination system IL, to condition a beam B of radiation. In this particular case, the illumination system also comprises a radiation source SO;

a first object table (e.g., mask table) MT provided with a patterning device holder to hold a patterning device MA (e.g., a reticle), and connected to a first positioner to accurately position the patterning device with respect to item PS;

a second object table (substrate table) WT provided with a substrate holder to hold a substrate W (e.g., a resist-coated silicon wafer), and connected to a second positioner to accurately position the substrate with respect to item PS;

a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning device as an alternative to the use of a classic mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 15 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 15. However, in the case of a wafer stepper (as opposed to a step-and-scan tool) the patterning device table MT may just be connected to a short stroke actuator, or may be fixed.

The depicted tool can be used in two different modes:
In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;
In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 16:
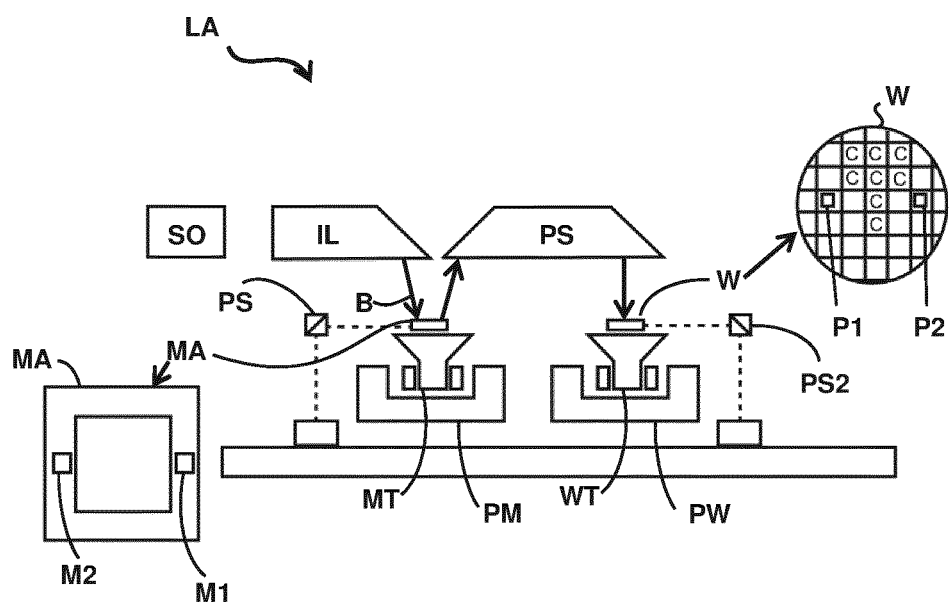
FIG. 16 is a schematic diagram of another lithographic projection apparatus, according to an embodiment.

FIG. 16 schematically depicts another exemplary lithographic projection apparatus 1000 whose illumination source could be optimized utilizing the methods described herein.

The lithographic projection apparatus 1000 includes:
a source collector module SO
an illumination system (illuminator) IL configured to condition a radiation beam B (e.g. EUV radiation).
a support structure (e.g. a mask table) MT constructed to support a patterning device (e.g. a mask or a reticle) MA and connected to a first positioner PM configured to accurately position the patterning device;
a substrate table (e.g. a wafer table) WT constructed to hold a substrate (e.g. a resist coated wafer) W and connected to a second positioner PW configured to accurately position the substrate; and
a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective mask). It is to be noted that because most materials are absorptive within the EUV wavelength range, the mask may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 16, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 16, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 17:
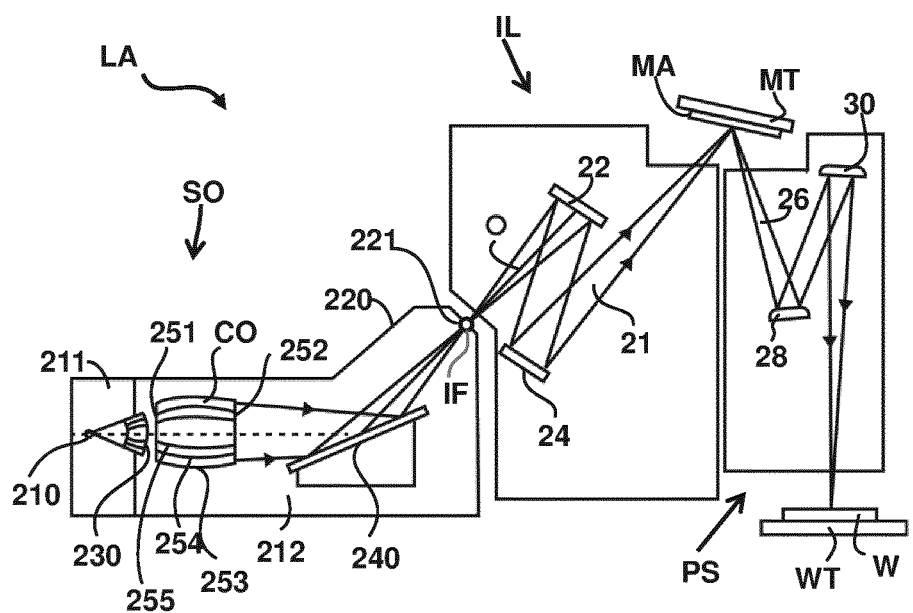
FIG. 17 is a more detailed view of the apparatus in FIG. 16, according to an embodiment.

FIG. 17 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line '0'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 17.

Collector optic CO, as illustrated in FIG. 17, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is preferably used in combination with a discharge produced plasma source, often called a DPP source.

Figure 18:
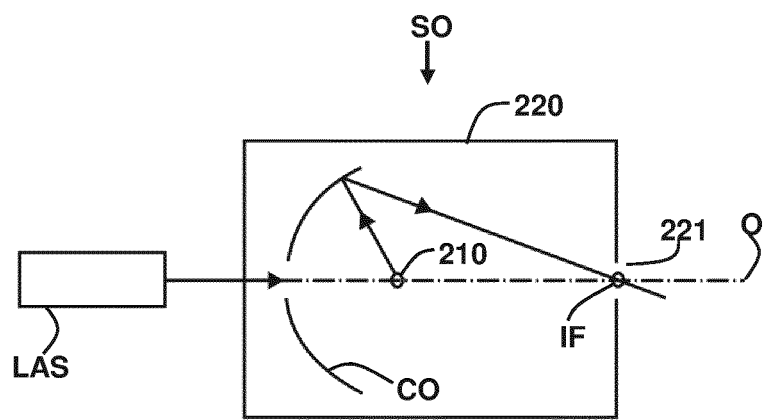
FIG. 18 is a more detailed view of the source collector module SO of the apparatus of FIGS. 16 and 17, according to an embodiment.

Alternatively, the source collector module SO may be part of an LPP radiation system as shown in FIG. 18. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

The embodiments may further be described using the following clauses:

1. A method of training a machine learning model configured to predict a post optimal proximity correction (OPC) image for a mask, the method comprising:
    obtaining (i) a pre-OPC image associated with a design layout to be printed on a substrate, (ii) an image of one or more assist features for the mask associated with the design layout, and (iii) a reference post-OPC image of the design layout; and
    training the machine learning model using the pre-OPC image and the image of the one or more assist features as input such that a difference between the reference image and a predicted post-OPC image of the machine learning model is reduced.
2. The method of clause 1, wherein the obtaining of the pre-OPC image and the image of the one or more assist features comprises:
    obtaining geometric shapes of the design layout and the one or more assist features; and generating, via image processing, the pre-OPC image from the geometric shapes of the design layout and another image from geometric shapes of the one or more assist features.
3. The method of clause 2, wherein the image processing comprises a rasterization operation based on the geometric shapes.
4. The method of clause 2, wherein the obtaining of the geometric shapes of the one or more assist features comprises:
    determining, via a rule-based approach, the geometric shapes of one or more assist features associated with the design layout; and/or determining, via a model-based approach, geometric shapes of one or more assist features associated with the design layout.

5. The method of any of clauses 1-4, wherein the obtaining of the reference image comprises:
performing a mask optimization process and/or a source mask optimization process using the design layout.

6. The method of clause 5, wherein the mask optimization process employs optical proximity correction process.

7. The method of clauses 1-6, wherein the training of the machine learning model is an iterative process, an iteration comprises:
inputting the pre-OPC image and the image of the one or more assist features to the machine learning model;
predicting the post-OPC image by simulating the machine learning model;
determining the difference between the predicted post-OPC image and the reference image; and
adjusting weights of the machine learning model such that the difference between the predicted and reference images is reduced.

8. The method of clause 7, wherein the adjusting the weights is based on a gradient decent of the difference.

9. The method of any of clauses 7-8, wherein the difference is minimized.

10. The method of any of clauses 1-9, further comprising:
obtaining geometric shapes of the design layout;
dissecting the geometric shapes of the design layout into a plurality of segments; and
determining corrections to the plurality of segments such that a difference between an image associated with the design layout and the predicted post-OPC image along the geometric shapes is reduced.

11. The method of clause 10, further comprising:
placing one or more evaluation points on each segment of a plurality of segments.

12. The method of any of clauses 10-11, wherein the determining of the corrections is an iterative process, an iteration comprising:
adjusting the plurality of segments of the geometric shapes;
generating an image from the adjusted geometric shapes of the design layout; and evaluating the difference between the generated image and the predicted post-OPC image along the geometric shapes within the respective images.

13. The method of clause 12, wherein the difference between the generated and predicted images is a difference in intensity values along the geometric shapes.

14. The method of any of clauses 12-13, wherein the adjusting the plurality of the segments comprises:
adjusting shape and/or position of at least a portion of the plurality of segments such that the difference between the generated and predicted images is reduced.

15. The method of any of clauses 12-14, wherein the difference between the generated image and the predicted post-OPC image is minimized.

16. The method of any of clauses 12-15, further comprising:
determining, via OPC simulation using the design layout and the corrections to the design layout, a mask layout to be used for manufacturing the mask for a patterning process.

17. The method of clause 16, wherein the OPC simulation comprises:
determining, via simulating a patterning process model using the geometric shapes of the design layout and the corrections associated with the plurality of segments, a simulated pattern that will be printed on a substrate; and
determining optical proximity corrections to the design layout such that a difference between the simulated pattern and the design layout is reduced.

18. The method of clause 17, wherein the determining optical proximity corrections is an iterative process, an iteration comprises:
adjusting the shapes and/or sizes of geometric shapes of primary features of the design layout and/or the one or more assist features such that a performance metric of the patterning process is reduced.

19. The method of clause 18, wherein the one or more assist features are extracted from the predicted post-OPC image of the machine learning model.

20. The method of any of clauses 18-19, wherein the performance metric comprises an edge placement error between the simulated pattern and the design layout, and/or CD values of the simulated pattern.

21. The method of any of clauses 1-20, wherein the pre-OPC image, the image of the assist feature, the predicted post-OPC image, and the reference image are pixelated images.

22. A method for training a machine learning model to predict a post optimal proximity correction (OPC) for a mask, the method comprising:
obtaining (i) a pre-OPC image associated with a design layout to be printed on a substrate, and (ii) a reference post-OPC image of the design layout; and
training the machine learning model using the pre-OPC image as input such that a difference between a predicted post-OPC image of the machine learning model and the reference image is reduced.

23. The method of clause 22, wherein the obtaining of the pre-OPC image comprises: obtaining geometric shapes of the design layout; and generating, via image processing, an image from the geometric shapes.

24. The method of clause 23, wherein the image processing comprises rasterization operation using the geometric shapes.

25. The method of any of clauses 22-24, wherein the obtaining of the reference image comprises:
performing a mask optimization process and/or a source mask optimization process using the design layout.

26. The method of clause 25, wherein the mask optimization process comprises optical proximity corrections.

27. The method of any of clauses 22-26, wherein the training of the machine learning model is an iterative process, an iteration comprises:
inputting the pre-OPC image to the machine learning model;
predicting the post-OPC image by simulating the machine learning model;
determining the difference between the predicted post-OPC image and the reference image; and
adjusting weights of the machine learning model such that the difference between the predicted and the reference images is reduced.

28. The method of clause 27, wherein the adjusting the weights is based on a gradient decent of the difference.

29. The method of any of clauses 22-27, wherein the difference is minimized.

30. A method for determining a post-OPC image for a mask, the method comprising:
obtaining a pre-OPC image associated with a design layout to be printed on a substrate;

determining a first post-OPC image of the mask by simulating a trained first machine learning model using the pre-OPC image, wherein the first post-OPC image comprises one or more assist features for the mask;

extracting geometric shapes of the one or more assist features of the first post-OPC image; and determining a second post-OPC image for the mask by simulating a trained second machine learning model using the pre-OPC image of the design layout and the extracted geometric shapes of the one or more assist features of the first post-OPC image.

31. The method of clause 30, further comprising:
determining, based on the second post-OPC image and the design layout, corrections to the design layout.

32. The method of clause 31, wherein the determining of the corrections is an iterative process, an iteration comprising:
obtaining geometric shapes of the design layout;
dissecting the geometric shapes of the design layout into a plurality of segments;
adjusting the plurality of segments;
generating an image from the adjusted geometric shapes of the design layout; and
evaluating the difference between the generated image and the second post-OPC image along the geometric shapes of the respective images.

33. The method of clause 32, wherein the adjusting of the plurality of the segments comprises:
adjusting shape and/or position of at least a portion of the plurality of segments such that the difference between the generated image and the second post-OPC image along the geometric shapes of the respective images is reduced.

34. The method of any of clauses 30-33, further comprising:
determining, via OPC simulation using the design layout and the corrections to the design layout, a mask layout to be used for manufacturing the mask for a patterning process.

35. A method for determining corrections to a design layout, the method comprising:
obtaining (i) a predicted post-OPC image via a training machine learning model that uses a pre-OPC image of the design layout and an image of the one or more assist features associated with the design layout, and (ii) geometric shapes of the design layout;
dissecting the geometric shapes of the design layout into a plurality of segments; and determining corrections to the plurality of segments such that a difference between an image of the design layout and the predicted post-OPC image along the geometric shapes is reduced.

36. The method of clause 35, further comprising:
placing one or more evaluation points on each segment of a plurality of segments.

37. The method of clause 36, wherein determining the corrections is an iterative process, an iteration comprising:
adjusting, via the one or more evaluation points, the plurality of segments;
generating an image from the adjusted geometric shapes of the design layout; and
evaluating the difference between the generated image and the predicted post-OPC image at the one or more evaluation points on the plurality of segments of the geometric shapes.

38. The method of clause 37, wherein the difference between the generated and predicted images is a difference in intensity values at the one or more evaluation points.

39. The method of clause 37, wherein the adjusting the plurality of the segments comprises: adjusting shape and/or position of at least a portion of the plurality of segments such that the difference between the generated and predicted images is reduced.

40. The method of any of clauses 35-39, wherein the difference between the generated image and the predicted post-OPC image is minimized.

41. The method of any of clauses 35-40, further comprising:
determining, via OPC simulation using the design layout and the corrections to the design layout, a mask layout.

42. The method of clause 41, wherein the OPC simulation comprises:
determining, via simulating a patterning process using the geometric shapes of the design layout and the corrections associated with the plurality of segments of the geometric shapes, a simulated pattern that will be printed on a substrate; and
determining optical proximity corrections to the design layout such that a difference between the simulated pattern and the design layout is reduced.

43. The method of clause 42, wherein the determining optical proximity corrections is an iterative process, an iteration comprises:
adjusting the shapes and/or sizes of the geometric shapes of primary features of the design layout and/or the one or more assist features such that a performance metric of the patterning process is reduced.

44. The method of clause 43, wherein the one or more assist features are extracted from the predicted post-OPC image of the machine learning model.

45. The method of any of clauses 43-44, wherein the performance metric comprises an edge placement error between the simulated pattern and the design layout, and/or CD values of the simulated pattern.

46. A computer program product comprising a non-transitory computer readable medium having instructions recorded thereon, the instructions when executed by a computer implementing the method of any of the above clauses.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

What is claimed is:

1. A method comprising:
obtaining (i) a pre-optical proximity correction (OPC) image associated with a design layout to be printed on a substrate, (ii) an image of one or more assist features for a mask associated with the design layout, and (iii) a reference post-OPC image of the design layout; and
training, by a hardware computer, a machine learning model using the pre-OPC image and the image of the one or more assist features as input such that a difference between the reference post-OPC image and a predicted post-OPC image predicted by the machine learning model is reduced, the predicted post-OPC image being of a mask pattern configured to be exposed with radiation to produce a printed pattern on a substrate.

2. The method of claim 1, wherein the obtaining of the pre-OPC image and the image of the one or more assist features comprises:
obtaining geometric shapes of the design layout and of the one or more assist features; and generating, via image processing, the pre-OPC image from the geometric shapes of the design layout and the image of the one or more assist features from the geometric shapes of the one or more assist features.

3. The method of claim 2, wherein the image processing comprises a rasterization operation based on the geometric shapes.

4. The method of claim 2, wherein the obtaining of the geometric shapes of the one or more assist features comprises:
determining, via a rule-based approach, the geometric shapes of one or more assist features associated with the design layout; and/or
determining, via a model-based approach, the geometric shapes of one or more assist features associated with the design layout.

5. The method of claim 1, wherein the obtaining of the reference post-OPC image comprises performing a mask optimization process and/or a source mask optimization process using the design layout.

6. The method of claim 5, wherein the obtaining of the reference post-OPC image comprises performing a mask optimization process and wherein the mask optimization process employs an optical proximity correction process.

7. The method of claim 1, wherein the training of the machine learning model is an iterative process, an iteration comprising:
inputting the pre-OPC image and the image of the one or more assist features to the machine learning model;
predicting the post-OPC image by using the machine learning model;
determining the difference between the predicted post-OPC image and the reference post-OPC image; and
adjusting one or more weights of the machine learning model such that the difference between the predicted and reference post-OPC images is reduced.

8. The method of claim 7, wherein the adjusting the one or more weights is based on a gradient descent of the difference.

9. The method of claim 7, wherein the difference is minimized.

10. The method of claim 1, further comprising:
obtaining geometric shapes of the design layout;
dissecting the geometric shapes of the design layout into a plurality of segments; and
determining corrections to the plurality of segments such that a difference between an image associated with the design layout and the predicted post-OPC image along the geometric shapes is reduced.

11. The method of claim 10, further comprising placing one or more evaluation points on each segment of the plurality of segments.

12. The method of claim 10, wherein the determining of the corrections is an iterative process, an iteration comprising:
adjusting the plurality of segments to form adjusted geometric shapes;
generating an image from the adjusted geometric shapes of the design layout; and
evaluating the difference between the generated image and the predicted post-OPC image along the geometric shapes within the respective images.

13. The method of claim 12, wherein the difference between the generated image and the predicted post-OPC image is a difference in intensity values along the geometric shapes, and/or wherein the adjusting the plurality of the segments comprises adjusting a shape and/or position of at least a portion of the plurality of segments such that the difference between the generated image and the predicted post-OPC image is reduced.

14. The method of claim 12, wherein the difference between the generated image and the predicted post-OPC image is minimized.

15. A computer program product comprising a non-transitory computer readable medium having instructions therein, the instructions, when executed by a computer system, configured to cause the computer system to at least:
obtain (i) a pre-optical proximity correction (OPC) image associated with a design layout to be printed on a substrate, (ii) an image of one or more assist features for a mask associated with the design layout, and (iii) a reference post-OPC image of the design layout; and
train a machine learning model configured to predict a post-OPC image, using the pre-OPC image and the image of the one or more assist features as input such that a difference between the reference post-OPC image and a predicted post-OPC image predicted by the machine learning model is reduced, the predicted post-OPC image being of a mask pattern configured to be exposed with radiation to produce a printed pattern on a substrate.

16. The computer program product of claim 15, wherein the instructions configured to cause the computer system to obtain the pre-OPC image and the image of the one or more assist features are further configured to cause the computer system to:
obtain geometric shapes of the design layout and of the one or more assist features; and
generate, via image processing, the pre-OPC image from the geometric shapes of the design layout and the image of the one or more assist features from the geometric shapes of the one or more assist features.

17. The computer program product of claim 16, wherein the image processing comprises a rasterization operation based on the geometric shapes.

18. The computer program product of claim 16, wherein the instructions configured to cause the computer system to obtain the geometric shapes of the one or more assist features are further configured to cause the computer system to:
determine, via a rule-based approach, the geometric shapes of one or more assist features associated with the design layout; and/or
determine, via a model-based approach, the geometric shapes of one or more assist features associated with the design layout.

19. The computer program product of claim 15, wherein the instructions configured to cause the computer system to obtain the reference post-OPC image are further configured to cause the computer system to perform a mask optimization process and/or a source mask optimization process using the design layout.

20. The computer program product of claim 15, wherein the instructions configured to cause the computer system to train the machine learning model are further configured to do so iteratively, an iteration comprising:
input of the pre-OPC image and the image of the one or more assist features to the machine learning model;
prediction of the post-OPC image by using the machine learning model;
determination of the difference between the predicted post-OPC image and the reference post-OPC image; and adjustment of one or more weights of the machine learning model such that the difference between the predicted and reference post-OPC images is reduced.

\* \* \* \* \*